United States Patent
Park et al.

(10) Patent No.: US 12,432,974 B2
(45) Date of Patent: Sep. 30, 2025

(54) SEMICONDUCTOR DEVICE

(71) Applicant: Samsung Electronics Co., Ltd., Suwon-si (KR)

(72) Inventors: Beom Jin Park, Suwon-si (KR); Myung Gil, Suwon-si (KR); Dong Won, Suwon-si (KR); Keun Hwi, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 490 days.

(21) Appl. No.: 18/062,116

(22) Filed: Dec. 6, 2022

(65) Prior Publication Data

US 2024/0186392 A1    Jun. 6, 2024

(30) Foreign Application Priority Data

Apr. 28, 2022  (KR) .................. 10-2022-0052580

(51) Int. Cl.
| | |
|---|---|
| H10D 30/67 | (2025.01) |
| H10D 30/43 | (2025.01) |
| H10D 62/10 | (2025.01) |
| H10D 64/23 | (2025.01) |
| H10D 84/83 | (2025.01) |

(52) U.S. Cl.
CPC ......... H10D 30/6735 (2025.01); H10D 30/43 (2025.01); H10D 62/121 (2025.01); H10D 64/258 (2025.01); H10D 84/83 (2025.01)

(58) Field of Classification Search
CPC ............ H10D 30/6735; H10D 62/121; H10D 84/834; H10D 30/62
See application file for complete search history.

(56) References Cited

U.S. PATENT DOCUMENTS

| | | |
|---|---|---|
| 9,871,140 B1 | 1/2018 | Balakrishnan et al. |
| 10,388,519 B2 | 8/2019 | Smith et al. |
| 10,665,669 B1 | 5/2020 | Xie et al. |
| 10,818,674 B2 | 10/2020 | Mann et al. |
| 10,985,161 B2 | 4/2021 | Xu et al. |
| 2020/0006559 A1 | 1/2020 | Mehandru et al. |

(Continued)

FOREIGN PATENT DOCUMENTS

| | | |
|---|---|---|
| KR | 10-2020-0012519 A | 2/2020 |
| KR | 10-2021-0014829 A | 2/2021 |

*Primary Examiner* — Brian Turner
(74) *Attorney, Agent, or Firm* — Fish & Richardson P.C.

(57) ABSTRACT

A semiconductor device including a substrate, a first and second active pattern extending in a first horizontal direction on the substrate, the second active pattern apart from the first active pattern in the first horizontal direction, first nanosheets apart from each other in a vertical direction on the first active pattern, second nanosheets apart from each other in the vertical direction on the first and second active patterns, a gate electrode extending in a second horizontal direction different from the first horizontal direction on the first active pattern and surrounding the first nanosheets, a source/drain region between the first and second nanosheets, an active cut penetrating the second nanosheets in the vertical direction, extending to the substrate, and separating the first and second active patterns, and a sacrificial layer between the source/drain region and the active cut, in contact with the active cut, and including silicon germanium may be provided.

20 Claims, 34 Drawing Sheets

(56) References Cited

U.S. PATENT DOCUMENTS

2020/0105539 A1* 4/2020 Takahashi ......... H01L 21/67161
2022/0277985 A1* 9/2022 Huang ............... H10D 84/0151
2022/0320312 A1   10/2022 Park et al.

* cited by examiner

SEMICONDUCTOR DEVICE

CROSS-REFERENCE TO RELATED APPLICATION

This application claims priority to Korean Patent Application No. 10-2022-0052580 filed on Apr. 28, 2022 in the Korean Intellectual Property Office and all the benefits accruing therefrom under 35 U.S.C. 119, the contents of which in its entirety are herein incorporated by reference.

BACKGROUND

1. Technical Field

The present disclosure relates to semiconductor devices. Specifically, the present disclosure relates to semiconductor devices including an MBCFET™ (Multi-Bridge Channel Field Effect Transistor).

2. Description of the Related Art

In recent years, with rapid supply of information media, functions of semiconductor devices have also been dramatically developed. In the case of recent semiconductor products, low cost is required to secure competitiveness, and high integration of products is required for high quality. For high integration, the semiconductor devices are being scaled down.

On the other hand, as a pitch size decreases, there is a need for research for reducing the capacitance between contacts in the semiconductor device and securing electrical stability.

SUMMARY

Aspects of the present disclosure provide a semiconductor device in which reliability is improved, by disposing a sacrificial layer including silicon germanium (SiGe) on both side walls of an active cut between a plurality of nanosheets of a portion in which the active cut is formed, thereby mitigating or preventing a short circuit due to a gate electrode between the plurality of nanosheets through which the active cut is formed.

According to an example embodiment of the present disclosure, a semiconductor device may include a substrate, a first active pattern extending in a first horizontal direction on the substrate, a second active pattern extending in the first horizontal direction on the substrate and spaced apart from the first active pattern in the first horizontal direction, a first plurality of nanosheets spaced apart from each other in a vertical direction on the first active pattern, a second plurality of nanosheets spaced apart from each other in the vertical direction on the first and second active patterns, a first gate electrode extending in a second horizontal direction different from the first horizontal direction on the first active pattern and surrounding the first plurality of nanosheets, a source/drain region between the first plurality of nanosheets and the second plurality of nanosheets, an active cut penetrating the plurality of second nanosheets in the vertical direction, extending to the substrate, and separating the first and second active patterns, and a sacrificial layer between the source/drain region and the active cut, being in contact with the active cut, and including silicon germanium (SiGe).

According to an example embodiment of the present disclosure, a semiconductor device may include a substrate, a first active pattern extending in a first horizontal direction on the substrate, a second active pattern extending in the first horizontal direction on the substrate and spaced apart from the first active pattern in the first horizontal direction, a plurality of nanosheets spaced apart from each other in a vertical direction on the first and second active patterns, an active cut penetrating the plurality of nanosheets in the vertical direction, extending to the substrate, and separating the first and second active patterns, a sacrificial layer between each of the first and second active patterns and a lowermost nanosheet among the plurality of nanosheets, being in contact with the active cut, and including silicon germanium (SiGe), a gate spacer on an uppermost nanosheet among the plurality of nanosheets and extending in a second horizontal direction different from the first horizontal along side walls of the active cut, and an insulating layer between the uppermost nanosheet among the plurality of nanosheets and the gate spacer, being in contact with the active cut, and including a material different from the gate spacer.

According to an example embodiment of the present disclosure, a semiconductor device may include a substrate, a first active pattern extending in a first horizontal direction on the substrate, a second active pattern extending in the first horizontal direction on the substrate and spaced apart from the first active pattern in the first horizontal direction, a first plurality of nanosheets spaced apart from each other in a vertical direction on the first active pattern, a second plurality of nanosheets spaced apart from each other in the vertical direction on the second active pattern, a third plurality of nanosheets spaced apart from each other in the vertical direction on each of the first and second active patterns, a first gate electrode on the first active pattern, the first gate electrode extending in a second horizontal direction different from the first horizontal direction and surrounding the first plurality of nanosheets, a second gate electrode on the second active pattern, the second gate electrode extending in the horizontal direction and surrounding the second plurality of nanosheets, a first source/drain region between the first plurality of nanosheets and the third plurality of nanosheets, a second source/drain region between the third plurality of nanosheets and the second plurality of nanosheets, an active cut penetrating the third plurality of nanosheets in the vertical direction, extending to the substrate, and separating the first and second active patterns, and a sacrificial layer between each of the first and second source/drain regions and the active cut, being in contact with the active cut, and including silicon germanium (SiGe), wherein a width in the first horizontal direction of the first gate electrode between the first active pattern and the first plurality of nanosheets is greater than a width in the first horizontal direction of the active cut below a lowermost nanosheet among the third plurality of nanosheets.

However, aspects of the present disclosure are not restricted to the ones set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail some example embodiments thereof referring to the attached drawings, in which.

DETAILED DESCRIPTION

Hereinafter, semiconductor devices according to some example embodiments of the present disclosure will be described referring to FIGS. 1 to 4.

Figure 1:
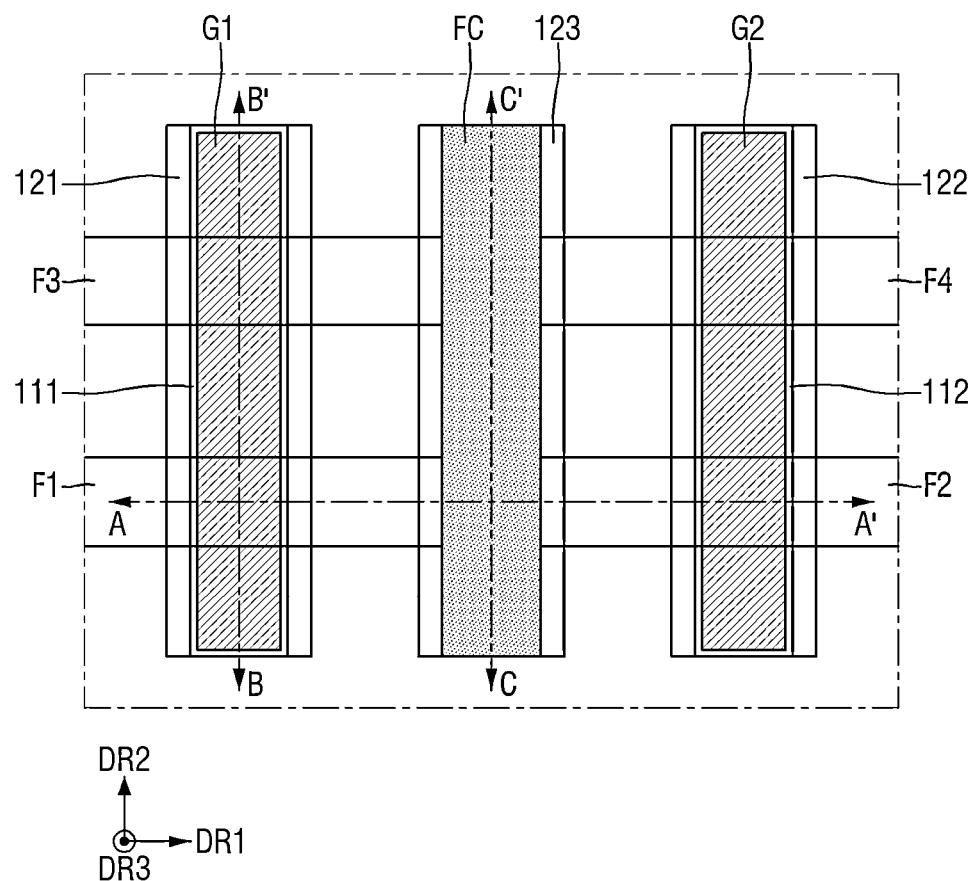
FIG. 1 is a schematic layout diagram for explaining a semiconductor device according to an example embodiment of this disclosure.
Figure 2:
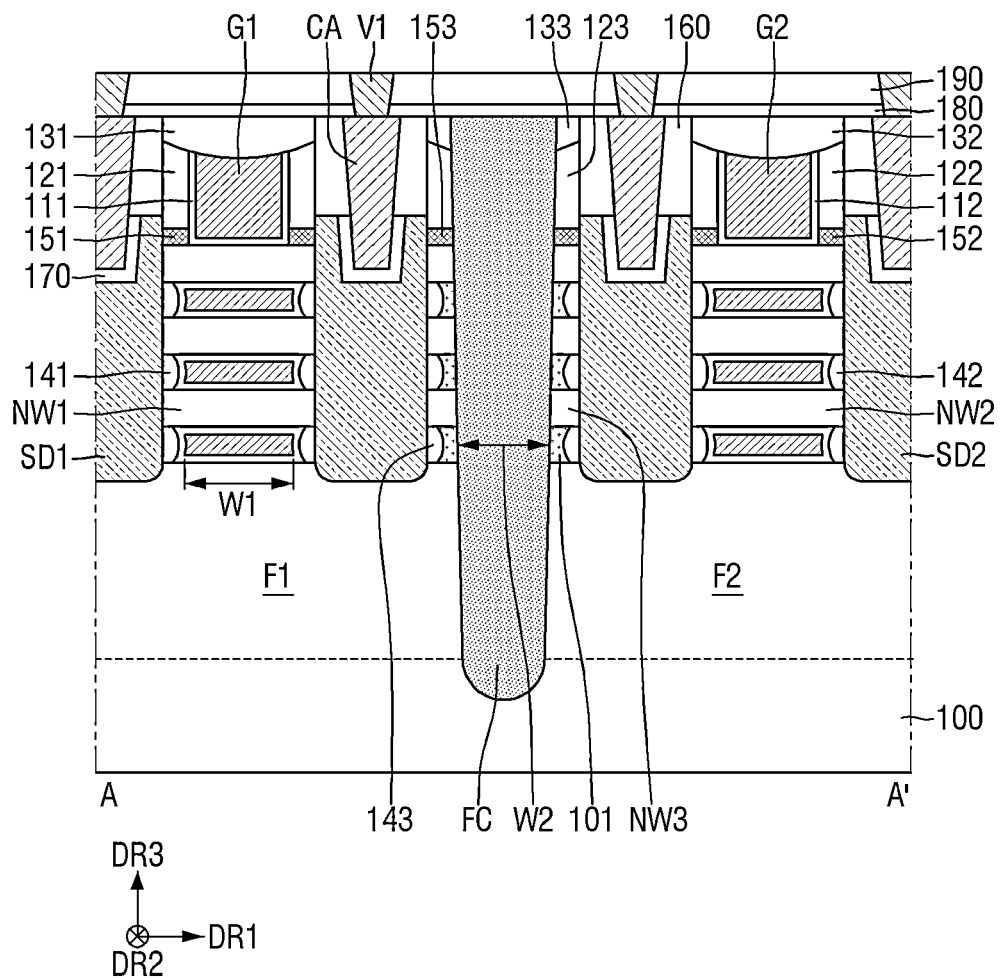
FIG. 2 is a cross-sectional view taken along a line A-A' of FIG. 1.
Figure 3:
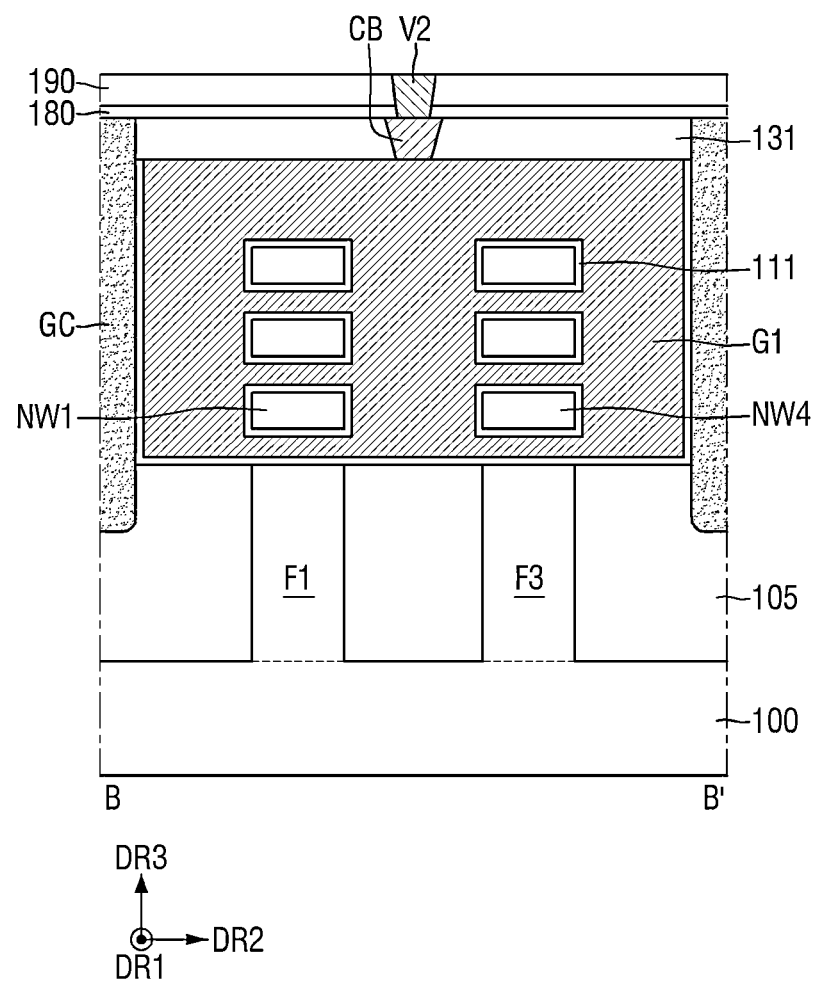
FIG. 3 is a cross-sectional view taken along a line B-B' of FIG. 1.
Figure 4:
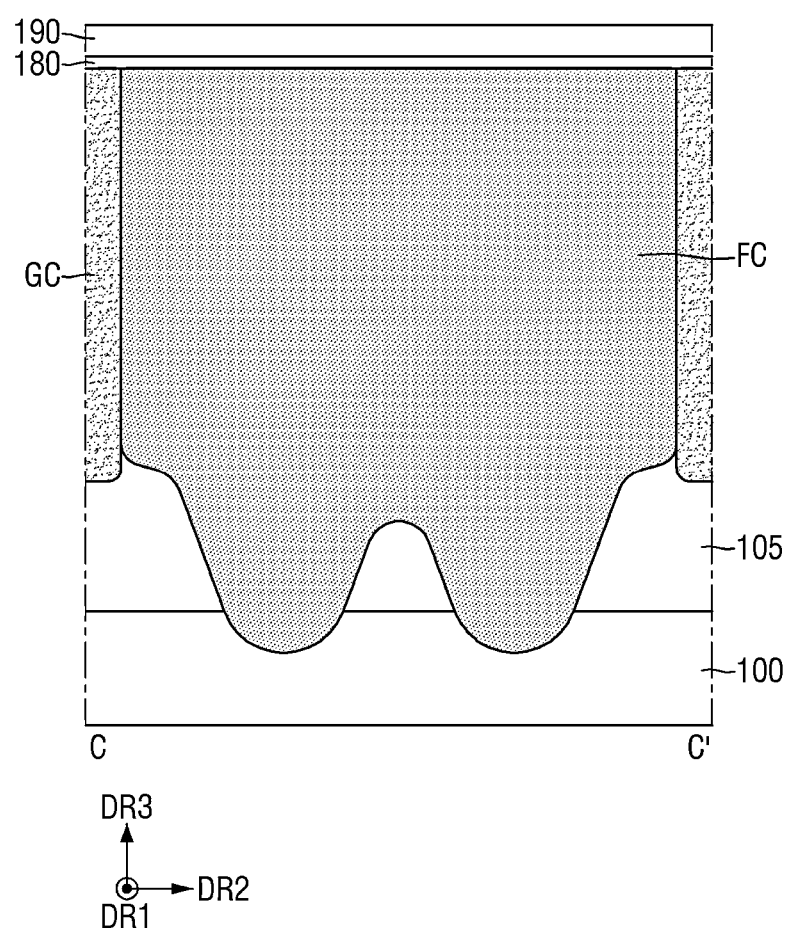
FIG. 4 is a cross-sectional view taken along a line C-C' of FIG. 1.

FIG. 1 is a schematic layout diagram for explaining the semiconductor device according to an example embodiment of this disclosure. FIG. 2 is a cross-sectional view taken along the line A-A' of FIG. 1. FIG. 3 is a cross-sectional view taken along the line B-B' of FIG. 1. FIG. 4 is a cross-sectional view taken along the line C-C' of FIG. 1.

Referring to FIGS. 1 to 4, the semiconductor device according to an example embodiment of the present disclosure includes a substrate 100, first to fourth active patterns F1, F2, F3, and F4, first to fourth nanosheets NW1, NW2, NW3, and NWs, a sacrificial layer 101, first and second gate electrodes G1 and G2, first and second gate insulating layers 111 and 112, first to third gate spacers 121, 122 and 123, first to third capping patterns 131, 132 and 133, first to third internal spacers 141, 142 and 143, first to third insulating layers 151, 152 and 153, first and second source/drain regions SD1 and SD2, a first interlayer insulating layer 160, a source/drain contact CA, a gate contact CB, a silicide layer 170, an etching stop layer 180, a second interlayer insulating layer 190, a first via V1, and a second via V2.

The substrate 100 may be a silicon substrate or an SOI (silicon-on-insulator). In some example embodiments, the substrate 100 may include silicon germanium, SGOI (silicon germanium on insulator), indium antimonide, lead tellurium compounds, indium arsenide, indium phosphide, gallium arsenide or gallium antimonide. Example embodiments of the present disclosure are not limited thereto.

Each of the first to fourth active patterns F1, F2, F3, and F4 may protrude from the substrate 100 in a vertical direction DR3. Here, the vertical direction DR3 may be defined as a direction perpendicular to each of a first horizontal direction DR1 and a second horizontal direction DR2 different from the first horizontal direction DR1. Each of the first to fourth active patterns F1, F2, F3, and F4 may be a part of the substrate 100, or may include an epitaxial layer that grows from the substrate 100. Each of the first to fourth active patterns F1, F2, F3, and F4 may extend in the first horizontal direction DR1.

The second active pattern F2 may be spaced apart from the first active pattern F1 in the first horizontal direction DR1. The third active pattern F3 may be spaced apart from the first active pattern F1 in the second horizontal direction DR2. The fourth active pattern F4 may be spaced apart from the third active pattern F3 in the first horizontal direction DR1. Further, the fourth active pattern F4 may be spaced apart from the second active pattern F2 in the second horizontal direction DR2.

A field insulating layer 105 may be disposed on the substrate 100. The field insulating layer 105 may surround side walls of each of the first to fourth active patterns F1, F2, F3, and F4. For example, although FIG. 3 shows that the upper surfaces of the first and third active patterns F1 and F3 are formed on the same plane as the upper surface of the field insulating layer 105, example embodiments of the present disclosure are not limited thereto. In some other example embodiments, the upper surfaces of each of the first to fourth active patterns F1, F2, F3, and F4 may protrude from the upper surface of the field insulating layer 105 in the vertical direction DR3.

A plurality of nanosheets may be disposed on each of the first to fourth active patterns F1, F2, F3, and F4. The plurality of nanosheets may be disposed over the first and second active patterns F1 and F2. The plurality of nanosheets may be disposed over the third and fourth active patterns F3 and F4. The plurality of nanosheets may include a plurality of nanosheets disposed apart from each other in the vertical direction DR3.

For example, a first plurality of nanosheets NW1 may be disposed on the first active pattern F1. A second plurality of nanosheets NW2 may be disposed on the second active pattern F2. A third plurality of nanosheets NW3 may be disposed on the first and second active patterns F1 and F2. A fourth plurality of nanosheets NW4 may be disposed on the third active pattern F3. The first plurality of nanosheets NW1, the third plurality of nanosheets NW3, and the second plurality of nanosheets NW2 may be sequentially spaced apart from each other in the first horizontal direction DR1. The fourth plurality of nanosheets NW4 may be spaced apart from the first plurality of nanosheets NW1 in the second horizontal direction DR2.

Each of the first to fourth nanosheets NW1. NW2, NW3, and NW4 may include a plurality of nanosheets spaced apart from each other in the vertical direction DR3. For example, each of the first to fourth nanosheets NW1, NW2, NW3, and NW4 may include three nanosheets spaced apart from each other in the vertical direction DR3. However, example embodiments of the present disclosure are not limited thereto. In some other example embodiments, each of the first to fourth nanosheets NW1, NW2, NW3, and NW4 may include four or more nanosheets spaced apart from each other in the vertical direction DR3.

A first gate electrode G1 may extend in the second horizontal direction DR2 on the first active pattern F1 and the third active pattern F3. The first gate electrode G1 may surround each of the first plurality of nanosheets NW1 and the third plurality of nanosheets NW3. A second gate electrode G2 may extend in the second horizontal direction DR2 on the second active pattern F2 and the fourth active pattern F4. The second gate electrode G2 may be spaced apart from the first gate electrode G1 in the first horizontal direction DR1. The second gate electrode G2 may surround the second plurality of nanosheets NW2.

Each of the first and second gate electrodes G1 and G2 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or combinations thereof. Each of the first and second gate electrodes G1 and G2 may include a conductive metal oxide, a conductive metal oxynitride, and the like, and may also include an oxidized form of the above-mentioned materials.

A first source/drain region SD1 may be disposed on at least one side of the first gate electrode G1 on the first active pattern F1. For example, the first source/drain region SD1 may be disposed on both sides of the first gate electrode G1 on the first active pattern F1. For example, the first source/drain region SD1 may be disposed between the first plurality of nanosheets NW1 and the third plurality of nanosheets NW3. The first source/drain region SD1 may be in contact with each of the first plurality of nanosheets NW1 and the third plurality of nanosheets NW3.

A second source/drain region SD2 may be disposed on at least one side of the second gate electrode G2 on the second active pattern F2. For example, the second source/drain region SD2 may be disposed on both sides of the second gate electrode G2 on the second active pattern F2. For example, the second source/drain region SD2 may be disposed between the third plurality of nanosheets NW3 and the second plurality of nanosheets NW2. The second source/drain region SD2 may be in contact with each of the third plurality of nanosheets NW3 and the second plurality of nanosheets NW2.

An active cut FC may be disposed on the substrate 100 and the field insulating layer 105. The active cut FC may penetrate the third plurality of nanosheets NW3 in the vertical direction DR3 and extend to the substrate 100. For example, at least a part of the active cut FC may extend into the substrate 100. The active cut FC may extend in the second horizontal direction DR2. For example, the upper surface of the active cut FC may be formed on the same plane as the upper surface of the first interlayer insulating layer 160.

For example, the upper surface of the field insulating layer 105 disposed below the active cut FC may be formed to be lower than the upper surface of the field insulating layer 105 disposed below the first gate electrode G1. However, example embodiments of the present disclosure are not limited thereto. For example, a width in the second horizontal direction DR2 of the active cut FC disposed inside the field insulating layer 105 may be greater than a width in the second horizontal direction DR2 of the first active pattern F1. However, example embodiments of the present disclosure are not limited thereto.

The active cut FC may be disposed between the first active pattern F1 and the second active pattern F2. The active cut FC may separate the first active pattern F1 and the second active pattern F2. The active cut FC may be in contact with each of the first active pattern F1 and the second active pattern F2. Further, the active cut FC may be disposed between the third active pattern F3 and the fourth active pattern F4. The active cut FC may separate the third active pattern F3 and the fourth active pattern F4. Further, the active cut FC may be in contact with each of the third active pattern F3 and the fourth active pattern F4.

For example, the width in the first horizontal direction DR1 of the active cut FC may decrease at it approaches the substrate 100. However, example embodiments of the present disclosure are not limited thereto. For example, the width W1 in the first horizontal direction DR1 of the first gate electrode G1 disposed between the first active pattern F1 and the first plurality of nanosheets NW1 may be greater than the width W2 in the first horizontal direction DR1 of the active cut FC disposed below the lowermost nanosheet among the third plurality of nanosheets NW3. Further, the width in the first horizontal direction DR1 of the second gate electrode G2 disposed between the second active pattern F2 and the second plurality of nanosheets NW2 may be greater than the width W2 in the first horizontal direction DR1 of the active cut FC disposed below the lowermost nanosheet among the third plurality of nanosheets NW3.

The active cut FC may include, for example, at least one of silicon nitride (SiN), silicon oxynitride (SiON), silicon oxide ($SiO_2$), silicon oxycarbonitride (SiOCN) or a combination thereof. However, example embodiments of the present disclosure are not limited thereto.

The gate cut GC may be disposed at a distal end in the second horizontal direction DR2 of each of the first gate electrode G1, the active cut FC, and the second gate electrode G2. For example, the upper surface of the gate cut GC may be formed on the same plane as the upper surface of the first interlayer insulating layer 160. For example, the lower surface of the gate cut GC may be formed inside the field insulating layer 105. However, example embodiments of the present disclosure are not limited thereto. In some other example embodiments, the lower surface of the gate cut GC may be in contact with the uppermost surface of the field insulating layer 105. The gate cut GC may include, for example, at least one of silicon nitride (SiN), silicon oxynitride (SiON), silicon oxide ($SiO_2$), silicon oxycarbonitride (SiOCN) or a combination thereof. However, example embodiments of the present disclosure are not limited thereto.

The first gate spacer 121 may extend in the second horizontal direction DR2 on both side walls of the first gate electrode G1. The first gate spacer 121 may be disposed on both side walls of the first gate electrode G1 on the uppermost nanosheet among the first plurality of nanosheets NW1. Although not shown, the first gate spacer 121 may be disposed on both side walls of the first gate electrode G1 on the field insulating layer 105.

The second gate spacer 122 may extend in the second horizontal direction DR2 on both side walls of the second gate electrode G2. The second gate spacer 122 may be disposed on both side walls of the second gate electrode G2 on the uppermost nanosheet among the second plurality of nanosheets NW2. Although not shown, the second gate spacer 122 may be disposed on both side walls of the second gate electrode G2 on the field insulating layer 105.

The third gate spacer 123 may extend in the second horizontal direction DR2 on both side walls of the active cut FC. The third gate spacer 123 may be disposed on both side walls of the active cut FC on the uppermost nanosheet among the third plurality of nanosheets NW3. Although not shown, the third gate spacer 123 may be disposed on both side walls of the active cut FC on the field insulating layer 105.

Each of the first to third gate spacers 121, 122, and 123 may include, for example, at least one of silicon nitride (SiN), silicon oxynitride (SiON), silicon carbonitride (SiCN), silicon oxycarbonitride (SiOCN), silicon boronitride (SiBN), silicon oxyboronitride (SiOBN), silicon oxycarbide (SiOC), or combinations thereof.

A first gate insulating layer 111 may be disposed between the first gate electrode G1 and the first gate spacer 121. The first gate insulating layer 111 may be disposed between the first gate electrode G1 and the first source/drain region SD1. The first gate insulating layer 111 may be disposed between the first gate electrode G1 and each of the first and third active patterns F1 and F3. The first gate insulating layer 111 may be disposed between the first gate electrode G1 and the first plurality of nanosheets NW1. The first gate insulating layer 111 may be disposed between the first gate electrode G1 and the field insulating layer 105. The first gate insulating layer 111 may be disposed between the first gate electrode G1 and the gate cut GC.

A second gate insulating layer 112 may be disposed between the second gate electrode G2 and the second gate spacer 122. The second gate insulating layer 112 may be disposed between the second gate electrode G2 and the second source/drain region SD2. The second gate insulating layer 112 may be disposed between the second gate electrode G2 and each of the second and fourth active patterns F2 and F4. The second gate insulating layer 112 may be disposed between the second gate electrode G2 and the second plurality of nanosheets NW2. The second gate insulating layer 112 may be disposed between the second gate electrode G2 and the field insulating layer 105. The second gate insulating layer 112 may be disposed between the second gate electrode G2 and the gate cut GC.

Each of the first and second gate insulating layers 111 and 112 may include at least one of silicon oxide, silicon oxynitride, silicon nitride or a high dielectric constant material having a higher dielectric constant than silicon oxide. The high dielectric constant material may include, for example, one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

A semiconductor device according to some other example embodiments may include an NC (Negative Capacitance) FET that uses a negative capacitor. For example, each of the first and second gate insulating layers 111 and 112 may include a ferroelectric material film having ferroelectric properties, and a paraelectric material film having paraelectric properties.

The ferroelectric material film may have a negative capacitance, and the paraelectric material film may have a positive capacitance. For example, when two or more capacitors are connected in series, and the capacitance of each capacitor has a positive value, the entire capacitance decreases from the capacitance of each individual capacitor. On the other hand, when at least one of the capacitances of two or more capacitors connected in series has a negative value, the entire capacitance may be greater than an absolute value of each individual capacitance, while having a positive value.

When the ferroelectric material film having the negative capacitance and the paraelectric material film having the positive capacitance are connected in series, the overall capacitance values of the ferroelectric material film and the paraelectric material film connected in series may increase. By the use of the increased overall capacitance value, a transistor including the ferroelectric material film may have a subthreshold swing (SS) of 60 mV/decade or less at room temperature.

The ferroelectric material film may have ferroelectric properties. The ferroelectric material film may include, for example, at least one of hafnium oxide, hafnium zirconium oxide, barium strontium titanium oxide, barium titanium oxide, or lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The type of dopant included in the ferroelectric material film may vary, depending on which type of ferroelectric material is included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), or yttrium (Y).

When the dopant is aluminum (Al), the ferroelectric material film may include 3 to 8 at % (atomic %) aluminum. Here, a ratio of the dopant may be a ratio of aluminum to the sum of hafnium and aluminum.

When the dopant is silicon (Si), the ferroelectric material film may include 2 to 10 at % silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film may have paraelectric properties. The paraelectric material film may include at least one of, for example, silicon oxide or metal oxide having a high dielectric constant. The metal oxide included in the paraelectric material film may include, for example, but not limited to, at least one of hafnium oxide, zirconium oxide, or aluminum oxide.

The ferroelectric material film and the paraelectric material film may include the same material. The ferroelectric material film has the ferroelectric properties, but the paraelectric material film may not have the ferroelectric properties. For example, when the ferroelectric material film and the paraelectric material film include hafnium oxide, a crystal structure of hafnium oxide included in the ferroelectric material film is different from a crystal structure of hafnium oxide included in the paraelectric material film.

The ferroelectric material film may have a thickness having the ferroelectric properties. The thickness of the ferroelectric material film may be, for example, but not limited to, 0.5 to 10 nm. Because a critical thickness that exhibits the ferroelectric properties may vary for each ferroelectric material, the thickness of the ferroelectric material film may vary depending on the ferroelectric material.

As an example, each of the first and second gate insulating layers 111 and 112 may include one ferroelectric material film. As another example, each of the first and second gate insulating layers 111 and 112 may include a plurality of ferroelectric material films spaced apart from each other. Each of the first and second gate insulating layers 111 and 112 may have a stacked film structure in which a plurality of ferroelectric material films and a plurality of paraelectric material films are alternately stacked.

A first capping pattern 131 may extend in the second horizontal direction DR2 on the first gate electrode G1 and the first gate insulating layer 111. For example, the first capping pattern 131 may be in contact with the upper surface of the first gate spacer 121. However, example embodiments of the present disclosure are not limited thereto. In some other example embodiments, the first capping pattern 131 may be disposed between the first gate spacers 121. In this case, the upper surface of the first capping pattern 131 may be formed on the same plane as the upper surface of the first gate spacer 121.

A second capping pattern 132 may extend in the second horizontal direction DR2 on the second gate electrode G2 and the second gate insulating layer 112. For example, the second capping pattern 132 may be in contact with the upper surface of the second gate spacer 122. However, example embodiments of the present disclosure are not limited thereto. In some other example embodiments, the second capping pattern 132 may be disposed between the second gate spacers 122. In this case, the upper surface of the second capping pattern 132 may be formed on the same plane as the upper surface of the second gate spacer 122.

A third capping pattern 133 may extend in the second horizontal direction DR2 along the side wall of the active cut FC on the upper surface of the third gate spacer 123. For example, the third capping pattern 133 may be in contact with the upper surface of the third gate spacer 123. For example, the third capping pattern 133 may be in contact with the side wall of the active cut FC.

The upper surfaces of each of the first to third capping patterns 131, 132, and 133 may be formed on the same plane as the upper surface of the first interlayer insulating layer 160. Further, the upper surfaces of each of the first to third capping patterns 131, 132, and 133 may be formed on the same plane as the upper surface of the active cut FC. Each of the first to third capping patterns 131, 132, and 133 may include, for example, at least one of silicon nitride (SiN), silicon oxynitride (SiON), silicon oxide ($SiO_2$), silicon carbonitride (SiCN), silicon oxycarbonitride (SiOCN), or a combination thereof.

A first insulating layer 151 may be disposed between the uppermost nanosheet among the first plurality of nanosheets NW1 and the first gate spacer 121. Although not shown, the first insulating layer 151 may be disposed between the field insulating layer 105 and the first gate spacer 121 on the field insulating layer 105. For example, the first insulating layer 151 may be in contact with the first gate insulating layer 111.

A second insulating layer 152 may be disposed between the uppermost nanosheet among the second plurality of nanosheets NW2 and the second gate spacer 122. Although not shown, the second insulating layer 152 may be disposed between the field insulating layer 105 and the second gate spacer 122 on the field insulating layer 105. For example, the second insulating layer 152 may be in contact with the second gate insulating layer 112.

A third insulating layer 153 may be disposed between the uppermost nanosheet among the third plurality of nanosheets NW3 and the third gate spacer 123. Although not shown, the third insulating layer 153 may be disposed between the field insulating layer 105 and the third gate spacer 123 on the field insulating layer 105. For example, the third insulating layer 153 may be in contact with the side wall of the active cut FC.

For example, each of the first and third insulating layers 151 and 153 may be in contact with the first source/drain region SD1, and each of the second and third insulating layers 152 and 153 may be in contact with the second source/drain region SD2. However, example embodiments of the present disclosure are not limited thereto. Each of the first to third insulating layers 151, 152, and 153 may include a material different from that of each of the first to third gate spacers 121, 122, and 123. For example, each of the first to third insulating layers 151, 152, and 153 may include a silicon oxide ($SiO_2$).

For example, the sacrificial layer 101 may be disposed between the third plurality of nanosheets NW3. The sacrificial layer 101 may be disposed between the first active pattern F1 and the lowermost nanosheet among the third plurality of nanosheets NW3. The sacrificial layer 101 may be disposed between the second active pattern F2 and the lowermost nanosheet among the third plurality of nanosheets NW3. The sacrificial layer 101 may be in contact with the side wall of the active cut FC. The sacrificial layer 101 may include, for example, silicon germanium (SiGe).

For example, a first internal spacer 141 may be disposed between each of the first plurality of nanosheets NW1. The first internal spacer 141 may be disposed between the first active pattern F1 and the lowermost nanosheet among the first plurality of nanosheets NW1. The first internal spacer 141 may be disposed on both side walls of the first gate electrode G1. The first internal spacer 141 may be disposed between the first source/drain region SD1 and the first gate insulating layer 111. The first internal spacer 141 may be in contact with the first source/drain region SD1.

For example, a second internal spacer 142 may be disposed between each of the second plurality of nanosheets NW2. The second internal spacer 142 may be disposed between the second active pattern F2 and the lowermost nanosheet among the second plurality of nanosheets NW2. The second internal spacer 142 may be disposed on both side walls of the second gate electrode G2. The second internal spacer 142 may be disposed between the second source/drain region SD2 and the second gate insulating layer 112. The second internal spacer 142 may be in contact with the second source/drain region SD2.

For example, a third internal spacer 143 may be disposed between each of the third plurality of nanosheets NW3. The third internal spacer 143 may be disposed between the first active pattern F1 and the lowermost nanosheet among the third plurality of nanosheets NW3. The third internal spacer 143 may be disposed between the second active pattern F2 and the lowermost nanosheet among the third plurality of nanosheets NW3.

The third internal spacer 143 may be disposed on both side walls of the active cut FC. The third internal spacer 143 may be disposed on the first source/drain region SD1 and on the sacrificial layer 101, which is disposed on one side wall of the active cut FC. Further, the third internal spacer 143 may be disposed on the second source/drain region SD2 and on the sacrificial layer 101 disposed the other side wall of the active cut FC. In other words, the third internal spacer 143 may be disposed between the first source/drain region SD1 and the sacrificial layer 101, which is disposed on one side wall of the active cut FC. Further, the third internal spacer 143 may be disposed between the second source/drain region SD2 and the sacrificial layer 101, which is disposed the other side wall of the active cut FC. The third internal spacer 143 may be in contact with each of the first and second source/drain regions SD1 and SD2. The third internal spacer 143 may be in contact with the sacrificial layer 101. In some other example embodiments, each of the first to third internal spacers 141, 142, and 143 may be omitted.

Each of the first to third internal spacers 141, 142, and 143 may include, for example, at least one of silicon nitride (SiN), silicon oxynitride (SiON), silicon oxide (SiO$_2$), silicon oxycarbonitride (SiOCN), silicon boronitride (SiBN), silicon oxyboronitride (SiOBN), silicon oxycarbide (SiOC), or combinations thereof. However, example embodiments of the present disclosure are not limited thereto.

The first interlayer insulating layer 160 may be disposed on the field insulating layer 105. The first interlayer insulating layer 160 may surround each of the first and second source/drain regions SD1 and SD2. The first interlayer insulating layer 160 may surround the side walls of each of the first gate electrode G1, the active cut FC, and the second gate electrode G2 on the first and second source/drain regions SD1 and SD2. For example, the upper surface of the first interlayer insulating layer 160 may be formed on the same plane as the upper surfaces of each of the first to third capping patterns 131, 132, and 133. For example, the upper surface of the first interlayer insulating layer 160 may be formed on the same plane as the upper surface of the active cut FC.

The first interlayer insulating layer 160 may include, for example, at least one of silicon oxide, silicon nitride, silicon oxynitride, or a low dielectric constant material. The low dielectric constant material may include, for example, but not limited to, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxy Ditertiary ButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof. However, example embodiments of the present disclosure are not limited thereto The source/drain contact CA may penetrate the first interlayer insulating layer 160 in the vertical direction DR3 and may be connected to the first source/drain region SD1. At least a part of the source/drain contact CA may extend into the first source/drain region SD1. Further, the source/drain contact CA may penetrate the first interlayer insulating layer 160 in the vertical direction DR3 and may be connected to the second source/drain region SD2. At least a part of the source/drain contact CA may extend into the second source/drain region SD2.

For example, the upper surface of the source/drain contact CA may be formed in the same plane as the upper surface of the first interlayer insulating layer 160. However, example embodiments of the present disclosure are not limited thereto. Although FIG. 2 shows that the source/drain contact CA is formed of a single film, this is for convenience of explanation, and example embodiments of the present disclosure are not limited thereto. That is, the source/drain contact CA may be formed of a plurality of films. The source/drain contact (CA) may include a conductive material.

The silicide layer 170 may be disposed between the first source/drain region SD1 and the source/drain contact CA. Further, the silicide layer 170 may be disposed between the second source/drain region SD2 and the source/drain contact CA. The silicide layer 170 may include, for example, a metal silicide material.

For example, the gate contact CB may penetrate the first capping pattern 131 in the vertical direction DR3 and may be connected to the first gate electrode G1. Although not shown, the gate contact CB may penetrate the second capping pattern 132 in the vertical direction DR3 and be connected to the second gate electrode G2. For example, the upper surface of the gate contact CB may be formed on the same plane as the upper surface of the first interlayer insulating layer 160. However, example embodiments of the present disclosure are not limited thereto. Although FIG. 3 shows that the gate contact CB is formed of a single film, this is for convenience of explanation, and example embodiments of the present disclosure are not limited thereto. That is, the gate contact CB may be formed of a plurality of films. The gate contact CB may include a conductive material.

The etching stop layer 180 may be disposed on the upper surfaces of each of the first interlayer insulating layer 160, the active cut FC, the gate cut GC, and the first to third capping patterns 131, 132, and 133. The etching stop layer 180 may be formed, for example, conformally. Although FIGS. 2 to 4 show that the etching stop layer 180 is formed of a single film, example embodiments of the present disclosure are not limited thereto. In some other example embodiments, the etching stop layer 180 may be formed of a plurality of films. The etching stop layer 180 may include, for example, at least one of aluminum oxide, aluminum nitride, hafnium oxide, zirconium oxide, silicon oxide, silicon nitride, silicon oxynitride or a low dielectric constant material.

The second interlayer insulating layer 190 may be disposed on the etching stop layer 180. The second interlayer insulating layer 190 may include, for example, at least one of silicon oxide, silicon nitride, silicon oxynitride or a low dielectric constant material.

The first via V1 may penetrate the second interlayer insulating layer 190 and the etching stop layer 180 in the vertical direction DR3, and be connected to the source/drain contact CA. Although FIG. 2 shows that the first via V1 is formed of a single film, this is for convenience of explanation, and example embodiments of the present disclosure are not limited thereto. In some other example embodiments, the first via V1 may be formed of a plurality of films. The first via V1 may include a conductive material.

The second via V2 may penetrate the second interlayer insulating layer 190 and the etching stop layer 180 in the vertical direction DR3 and be connected to the gate contact CB. Although FIG. 3 shows that the second via V2 is formed of a single film, this is for convenience of explanation, and example embodiments of the present disclosure are not limited thereto. In some other example embodiments, the second via V2 may be formed of a plurality of films. The second via V2 may include a conductive material.

Hereinafter, a method for fabricating a semiconductor device according to an example embodiment of the present disclosure will be described referring to FIGS. 2 to 27.

FIGS. 5 to 27 are intermediate stage diagrams for explaining a method for fabricating a semiconductor device according to an example embodiment of the present disclosure.

Figure 5:
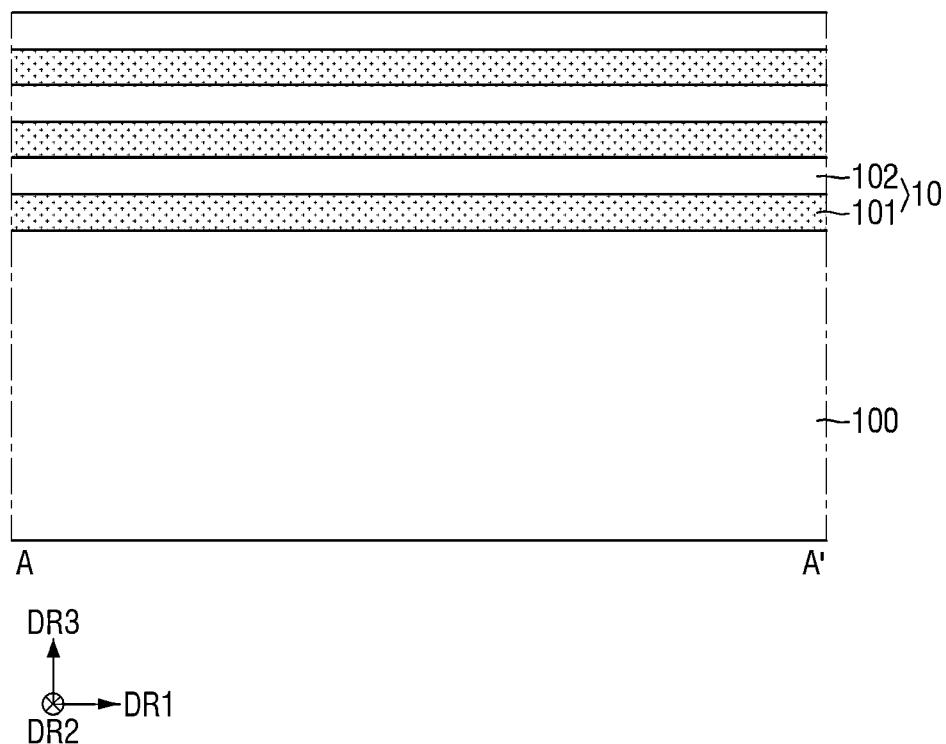
FIGS. 5 to 27 are intermediate process diagrams for explaining a method of fabricating a semiconductor device according to an example embodiment of the present disclosure.
Figure 6:
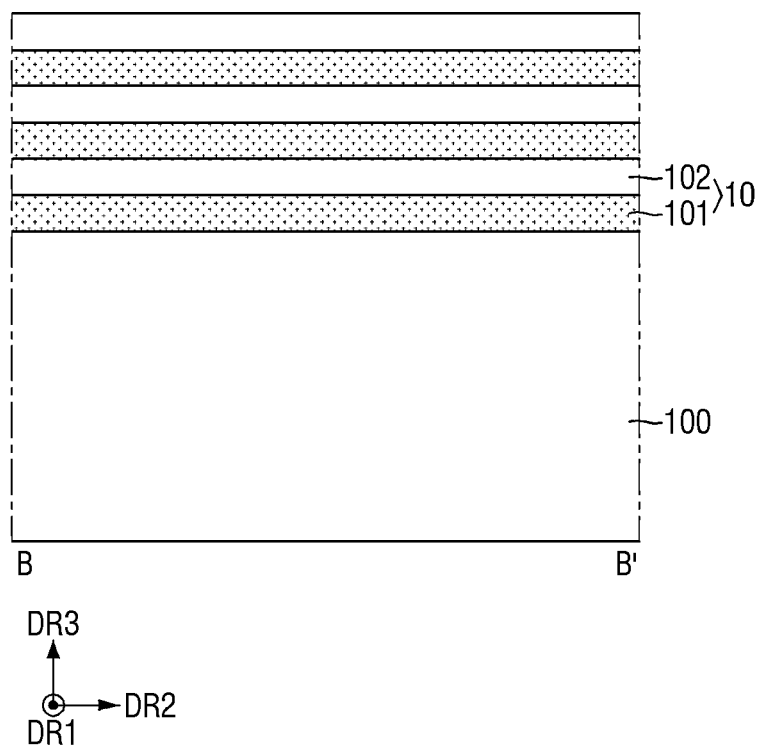

Referring to FIGS. 5 and 6, a stacked structure 10 in which the sacrificial layer 101 and the semiconductor layer 102 are alternately stacked may be formed on the substrate 100. For example, the sacrificial layer 101 may be formed at the lowermost part of the stacked structure 10, and the semiconductor layer 102 may be formed at the uppermost part of the stacked structure 10. However, example embodiments of the present disclosure are not limited thereto. In some other example embodiments, the sacrificial layer 101 may also be formed on the uppermost part of the stacked structure 10. The sacrificial layer 101 may include, for example, silicon germanium (SiGe). The semiconductor layer 102 may include, for example, silicon (Si).

Figure 7:
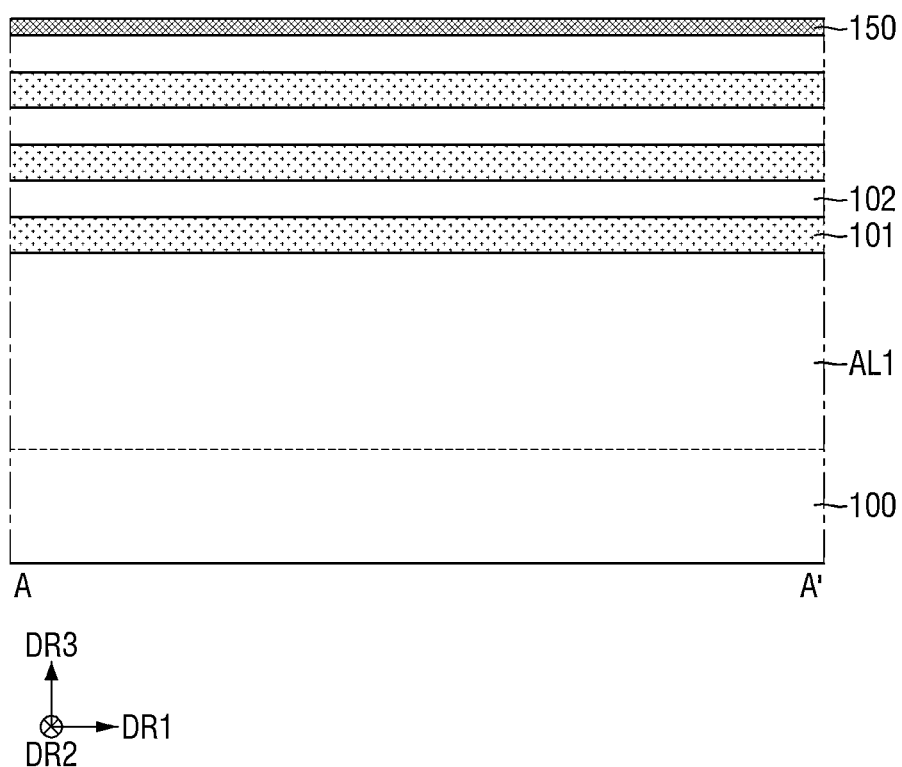
Figure 8:
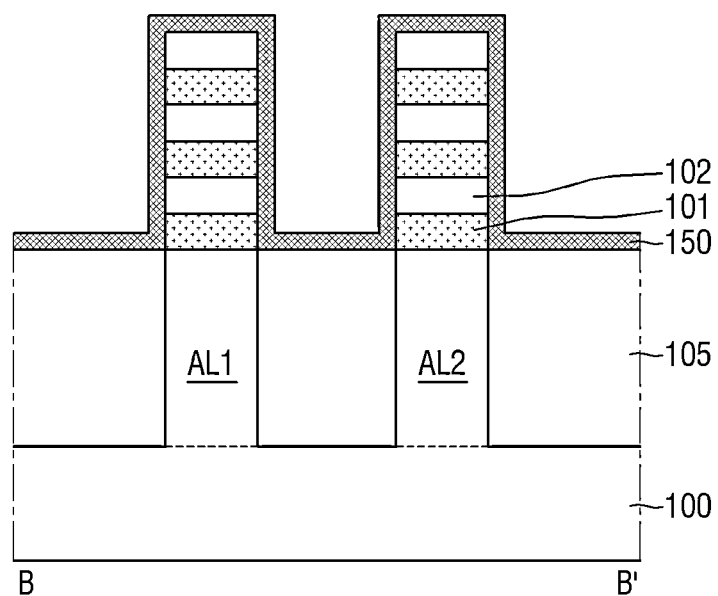
Figure 8:
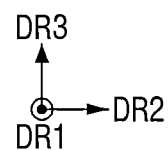

Referring to FIGS. 7 and 8, a first active layer AL1 and a second active layer AL2 each extending in the first horizontal direction DR1 may be formed on the substrate 100 by etching a part of the stacked structure (10 of FIGS. 5 and 6) and the substrate 100. The second active layer AL2 may be spaced apart from the first active layer AL1 in the second horizontal direction DR2. The first active layer AL1 and the second active layer AL2 may protrude from the upper surface of the substrate 100 in the vertical direction DR3.

Subsequently, a field insulating layer 105 that surrounds the side walls of each of the first active layer AL1 and the second active layer AL2 may be formed on the substrate 100. Subsequently, the insulating material layer 150 may be formed on the side walls of the sacrificial layer 101 and the semiconductor layer 102 that remain on each of the first active layer AL1 and the second active layer AL2. The insulating material layer 150 may also be formed on the upper surface of the semiconductor layer 102 formed at the uppermost part and the upper surface of the field insulating layer 105. For example, the insulating material layer 150 may be conformally formed. The insulating material layer 150 may include, for example, silicon oxide ($SiO_2$).

Figure 9:
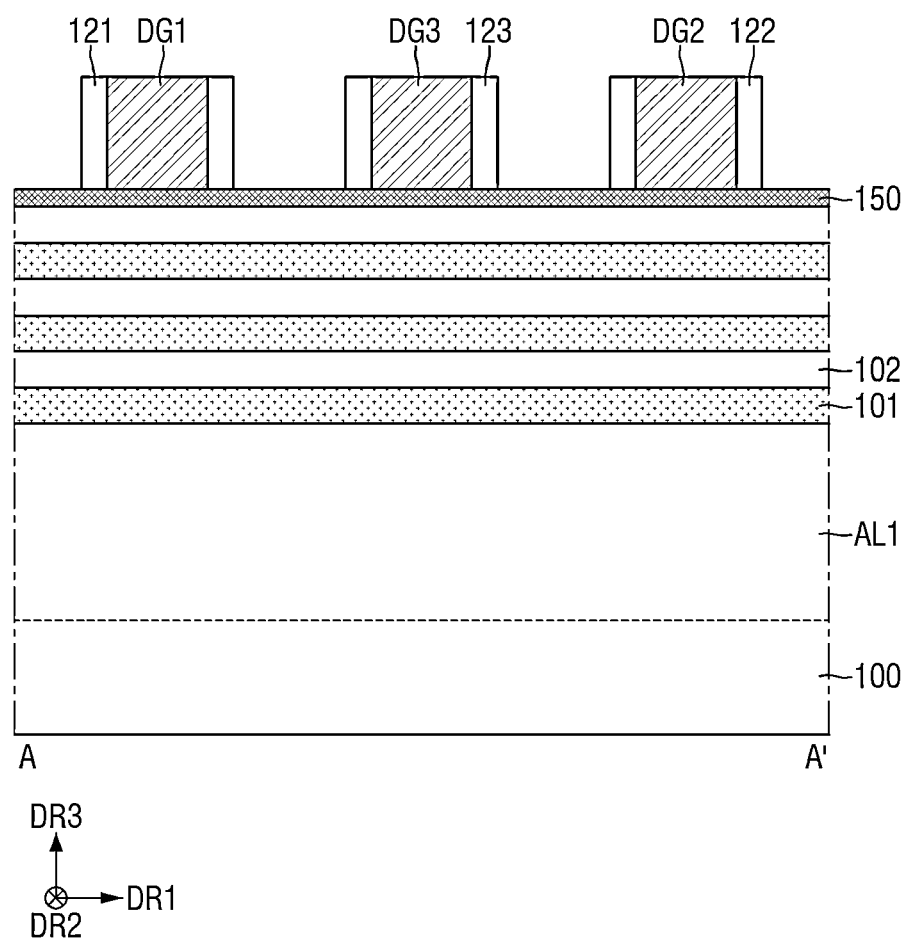
Figure 10:
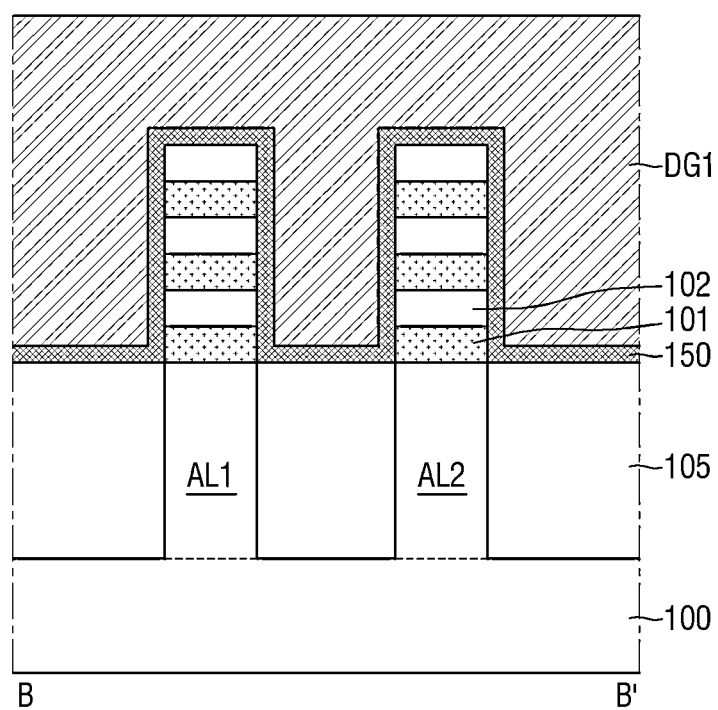
Figure 10:
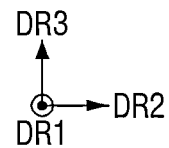

Referring to FIGS. 9 and 10, the first to third dummy gates DG1, DG2, and DG3 extending in the second horizontal direction DR2 may be formed on the insulating material layer 150. The third dummy gate DG3 may be spaced apart from the first dummy gate DG1 in the first horizontal direction DR1. Further, the second dummy gate DG2 may be spaced apart from the third dummy gate DG3 in the first horizontal direction DR1. That is, the third dummy gate DG3 may be formed between the first dummy gate DG1 and the second dummy gate DG2.

Next, the first to third gate spacers 121, 122, and 123 extending in the second horizontal direction DR2 along the side walls of each of the first to third dummy gates DG1, DG2, and DG3 may be formed. For example, a first gate spacer 121 is formed along both side walls of the first dummy gate DG1, a second gate spacer 122 is formed along both side walls of the second dummy gate DG2, and a third gate spacer 123 may be formed along both side walls of the third dummy gate DG3.

Figure 11:
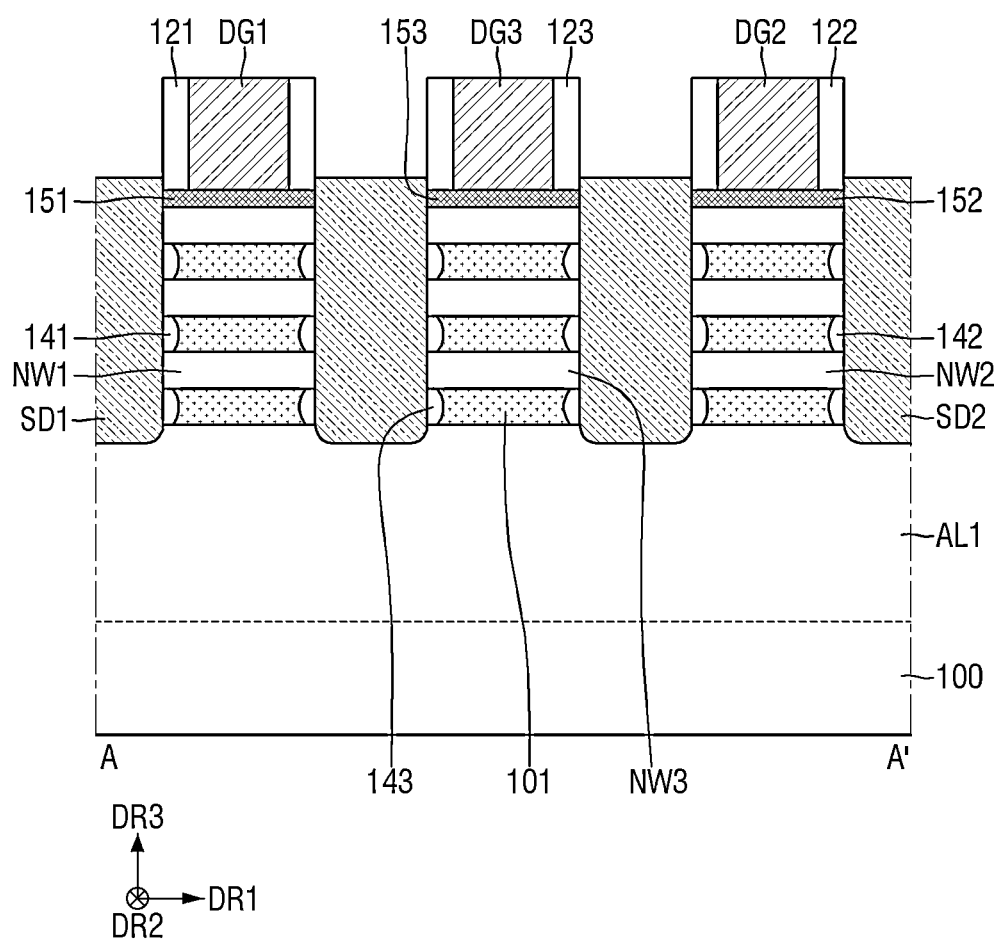

Referring to FIG. 11, the insulating material layer (150 of FIGS. 9 and 10), the sacrificial layer 101 and the semiconductor layer (102 of FIGS. 9 and 10) may be etched, by utilizing the first to third dummy gates DG1, DG2, and DG3 and the first to third gate spacers 121, 122, and 123 as mask patterns. For example, while the sacrificial layer 101 and the semiconductor layer 102 are etched, a part of the first active layer AL1 and a part of the second active layer AL2 may also be etched.

The insulating material layer (150 of FIGS. 9 and 10) that remains unetched below the first dummy gate DG1 may be defined as the first insulating layer 151. The insulating material layer (150 of FIGS. 9 and 10) that remains unetched below the second dummy gate DG2 may be defined as the second insulating layer 152. The insulating material layer (150 of FIGS. 9 and 10) that remains unetched below the third dummy gate DG3 may be defined as the third insulating layer 153.

Further, the semiconductor layer (102 of FIGS. 9 and 10) that remains unetched below the first dummy gate DG1 may be defined as the first plurality of nanosheets NW1. The semiconductor layer (102 of FIGS. 9 and 10) that remains unetched below the second dummy gate DG2 may be defined as the second plurality of nanosheets NW2. The semiconductor layer (102 of FIGS. 9 and 10) that remains unetched below the third dummy gate DG3 may be defined as the third plurality of nanosheets NW3.

After that, a part of both side walls of the remaining sacrificial layer 101 may be etched through a wet etching process. Next, the first to third internal spacers 141, 142, and 143 may be formed in the portion in which a part of both side walls of the sacrificial layer 101 is etched. For example, the first internal spacer 141 may be formed in a portion in which a part of both side walls of the sacrificial layer 101 is etched below the first dummy gate DG1. The second internal spacer 142 may be formed in a portion in which a part of both side walls of the sacrificial layer 101 is etched below the second dummy gate DG2. The third internal spacer 143 may be formed in a portion in which a part of both side walls of the sacrificial layer 101 is etched below the third dummy gate DG3.

Subsequently, the first source/drain region SD1 may be formed on both side walls of the first plurality of nanosheets NW1 on the first active layer AL1. That is, the source/drain region formed between the first plurality of nanosheets NW1 and the third plurality of nanosheets NW3 may be defined as the first source/drain region SD1. Further, the second source/drain region SD2 may be formed on both side walls of the second plurality of nanosheets NW2 on the first active layer AL1. That is, the source/drain region formed between the third plurality of nanosheets NW3 and the second plurality of nanosheets NW2 may be defined as the second source/drain region SD2.

The first source/drain region SD1 may be in contact with one side wall of the first plurality of nanosheets NW1 and the third plurality of nanosheets NW3. The first source/drain region SD1 may be in contact with each of the first internal spacer 141 and the third internal spacer 143 formed on one side wall of the third plurality of nanosheets NW3. The second source/drain region SD2 may be in contact with the other side wall of the second plurality of nanosheets NW2 and the third plurality of nanosheets NW3. The second source/drain region SD2 may be in contact with each of the second internal spacer 142 and the third internal spacer 143 formed on the other side wall of the third plurality of nanosheets NW3.

For example, the upper surfaces of each of the first and second source/drain regions SD1 and SD2 may be formed to be higher than the uppermost surfaces of each of the first and third insulating layers 151, 152, and 153. However, example embodiments of the present disclosure are not limited thereto.

Figure 12:
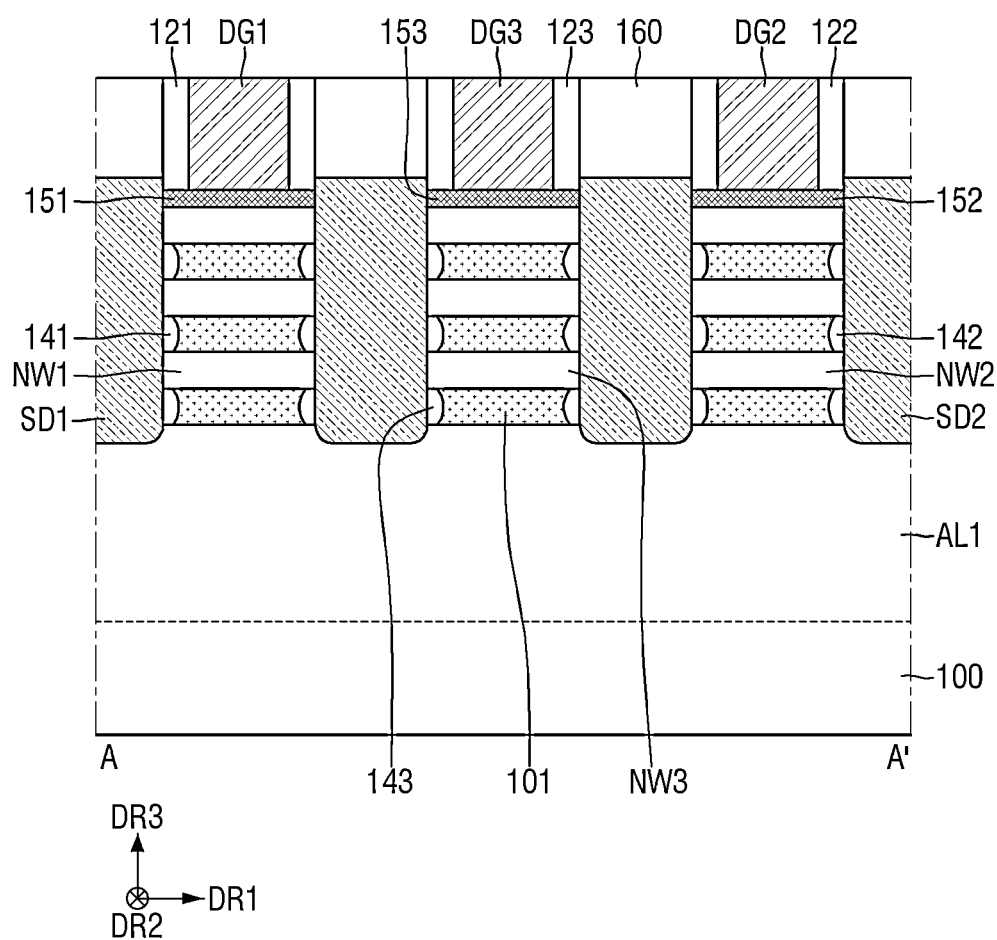

Referring to FIG. 12, a first interlayer insulating layer 160 may be formed to cover each of the first to third dummy gates DG1, DG2, and DG3 on each of the first and second source/drain regions SD1 and SD2. Next, a flattening process (for example, a CMP process) may be performed to expose the upper surfaces of the first to third dummy gates DG1, DG2, and DG3.

Figure 13:
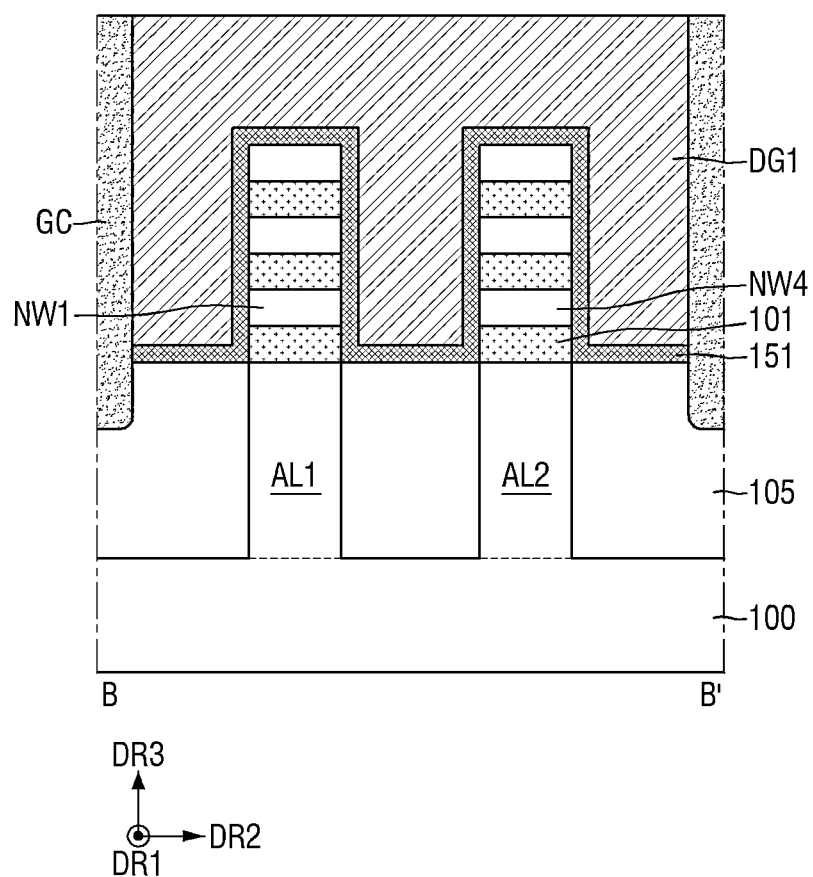

Referring to FIG. 13, for example, a gate cut GC that penetrates the first dummy gate DG1 in the vertical direction DR3 and separates the first dummy gate DG1 may be formed. For example, the gate cut GC may be formed at both distal ends in the second horizontal direction DR2 of the first dummy gate DG1 formed on the first and second active layers AL1 and AL2. Although not shown in FIG. 13, the gate cut GC may also be formed at both distal ends in the second horizontal direction DR2 of each of the second dummy gate (DG2 of FIG. 12) and the third dummy gate (DG3 of FIG. 12). In FIG. 13, the plurality of nanosheets formed below the first dummy gate DG1 on the second active layer AL2 may be defined as the fourth plurality of nanosheets NW4.

Figure 14:
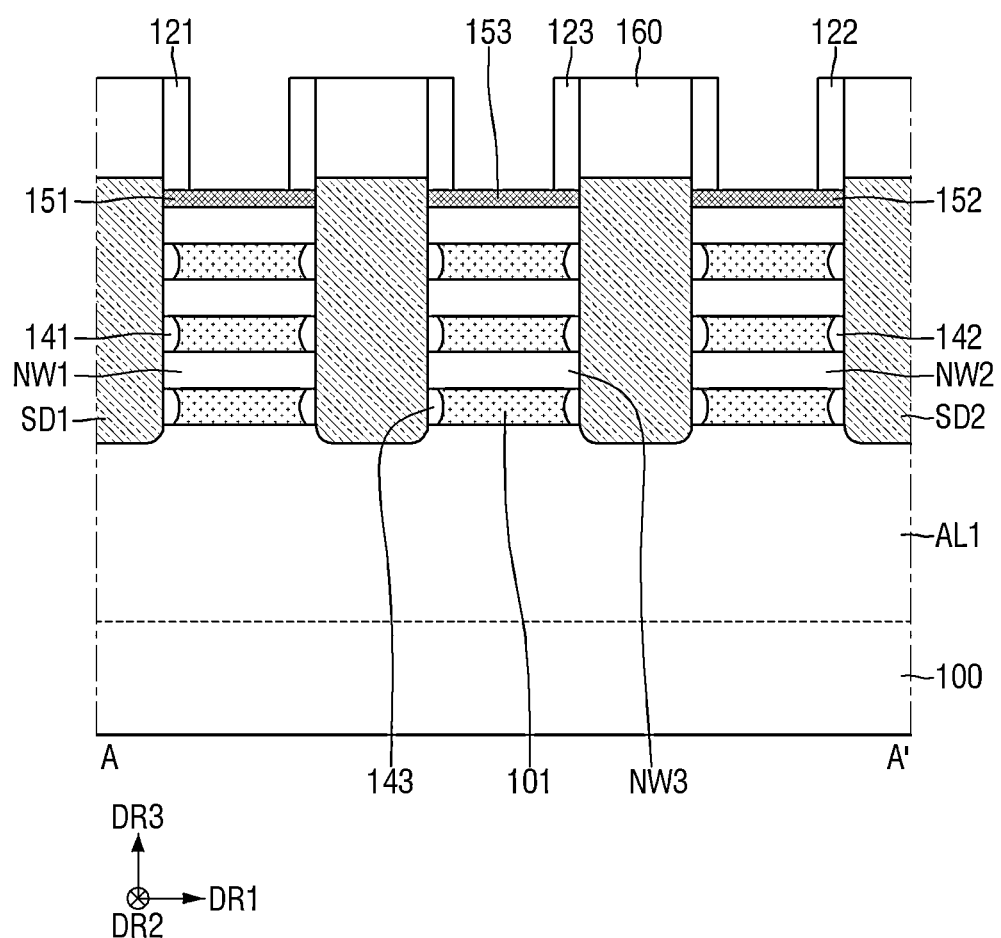
Figure 15:
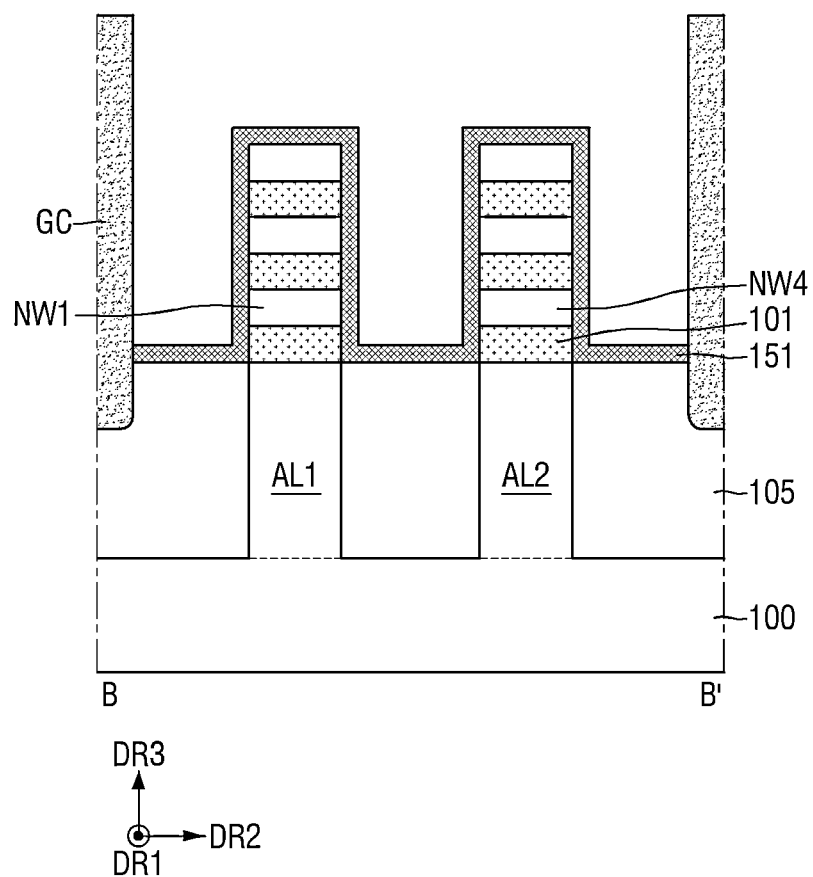

Referring to FIGS. 14 and 15, each of the first to third dummy gates (DG1, DG2, and DG3 of FIG. 12) may be removed. Thus, the first to third insulating layers 151, 152, and 153 may be exposed.

Figure 16:
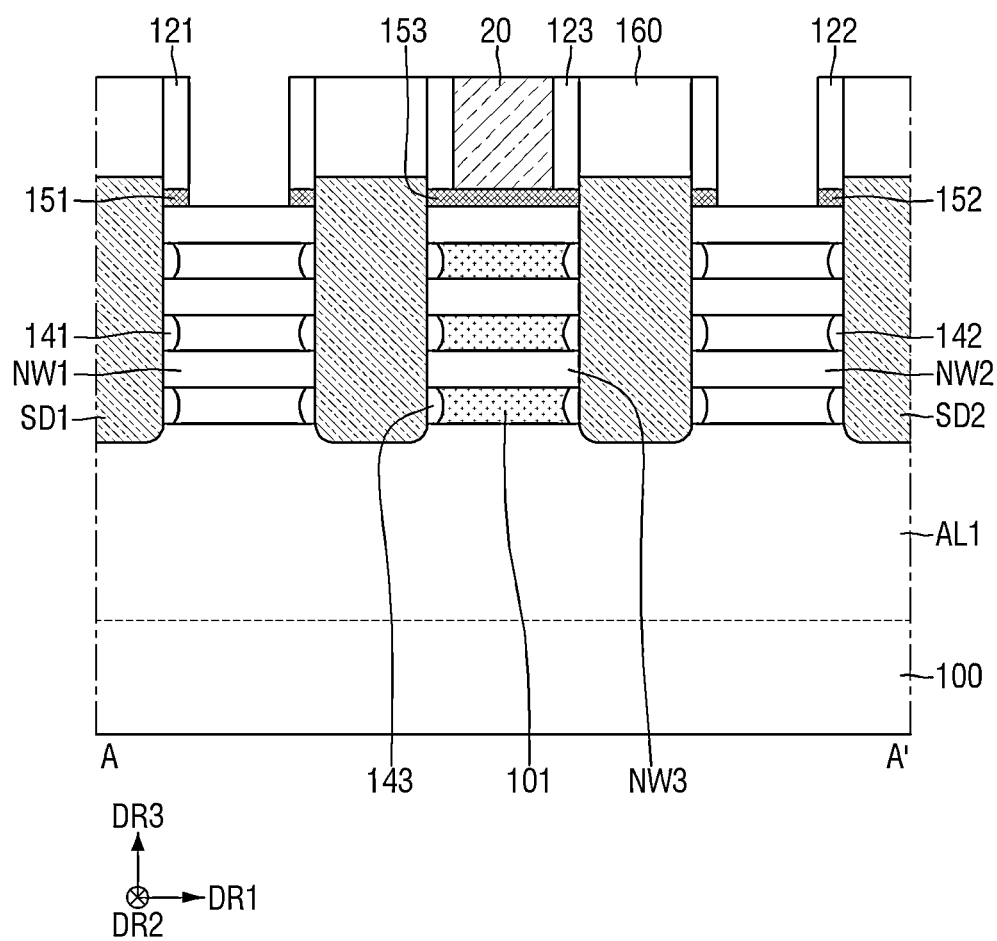
Figure 17:
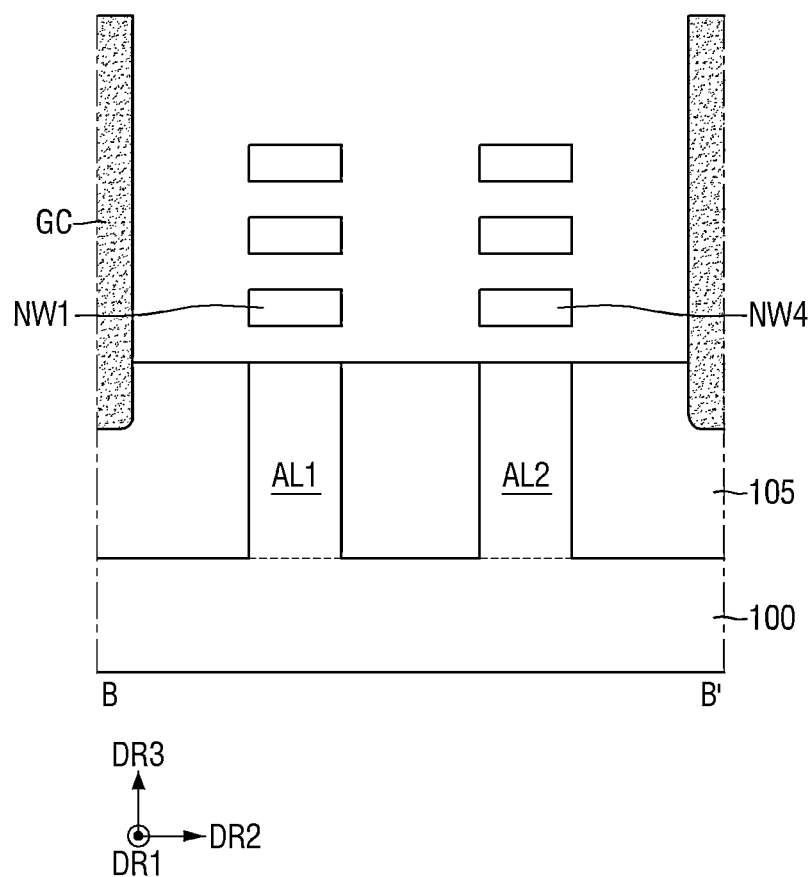
Figure 18:
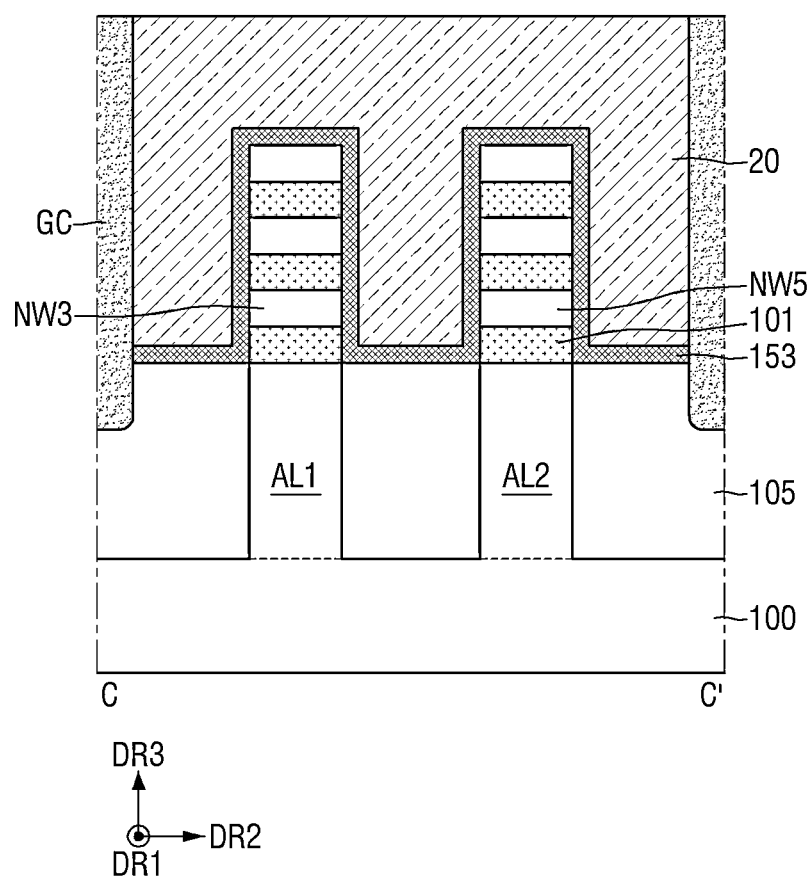

Referring to FIGS. 16 to 18, a protective layer 20 may be formed in the portion from which the third dummy gate (DG3 of FIG. 12) is removed. The protective layer 20 may be formed to cover the third insulating layer 153. The protective layer 20 may include, for example, SOH, but example embodiments of the present disclosure are not limited thereto.

Next, a part of the first insulating layer 151 exposed to the portion from which the first dummy gate (DG1 of FIG. 12) is removed, and a part of the second insulating layer 152 exposed to the portion from which the second dummy gate (DG2 of FIG. 12) is removed may be etched. Subsequently, the sacrificial layer 101 surrounding the first plurality of nanosheets NW1 and the sacrificial layer 101 surrounding the second plurality of nanosheets NW2 may be removed. In this case, the sacrificial layer 101 surrounding the third plurality of nanosheets NW3 is not removed. In FIG. 18, the plurality of nanosheets formed below the protective layer 20 on the second active layer AL2 may be defined as a fifth plurality of nanosheets NW5.

Figure 19:
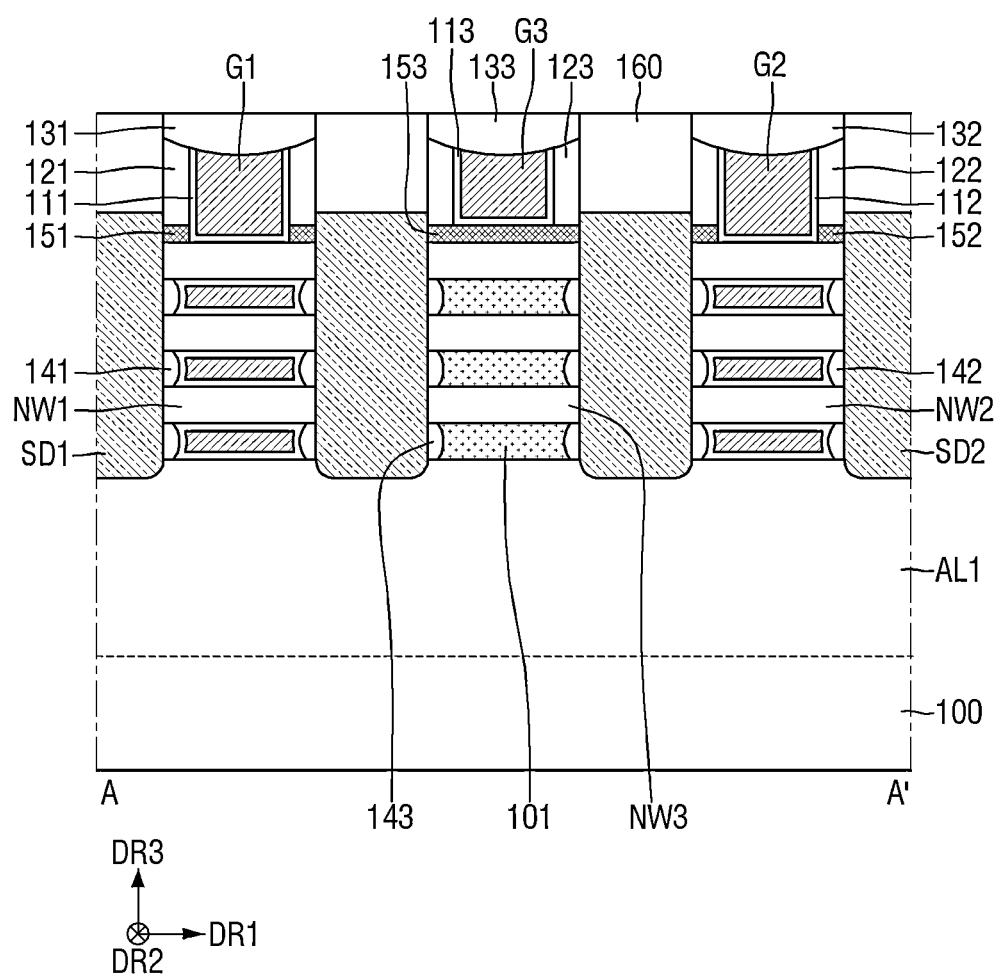
Figure 20:
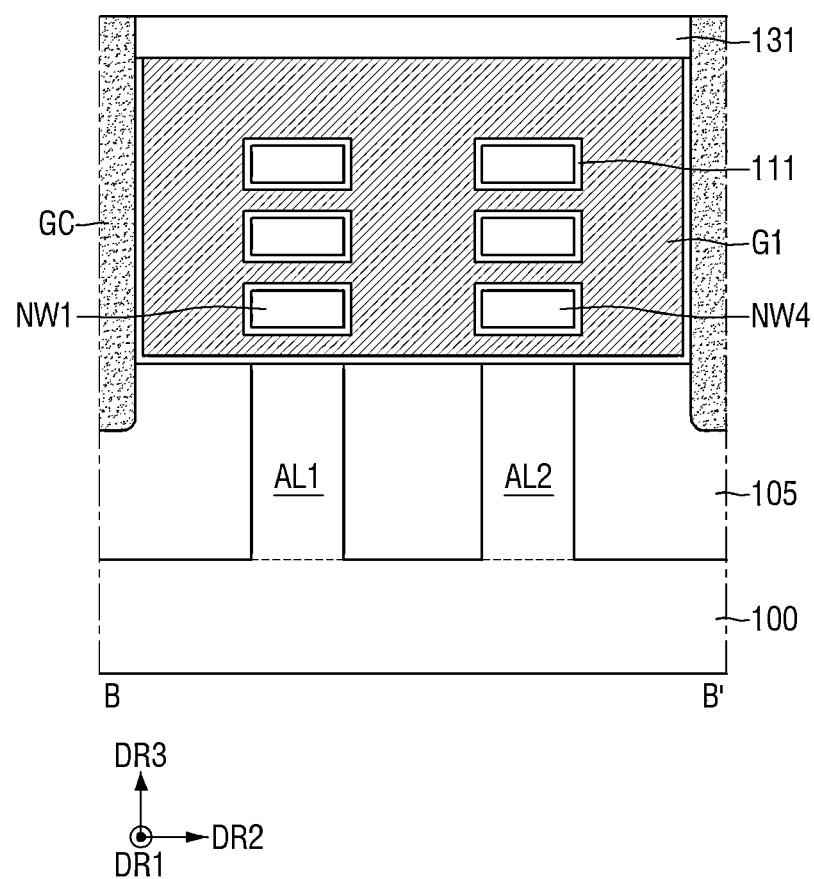
Figure 21:
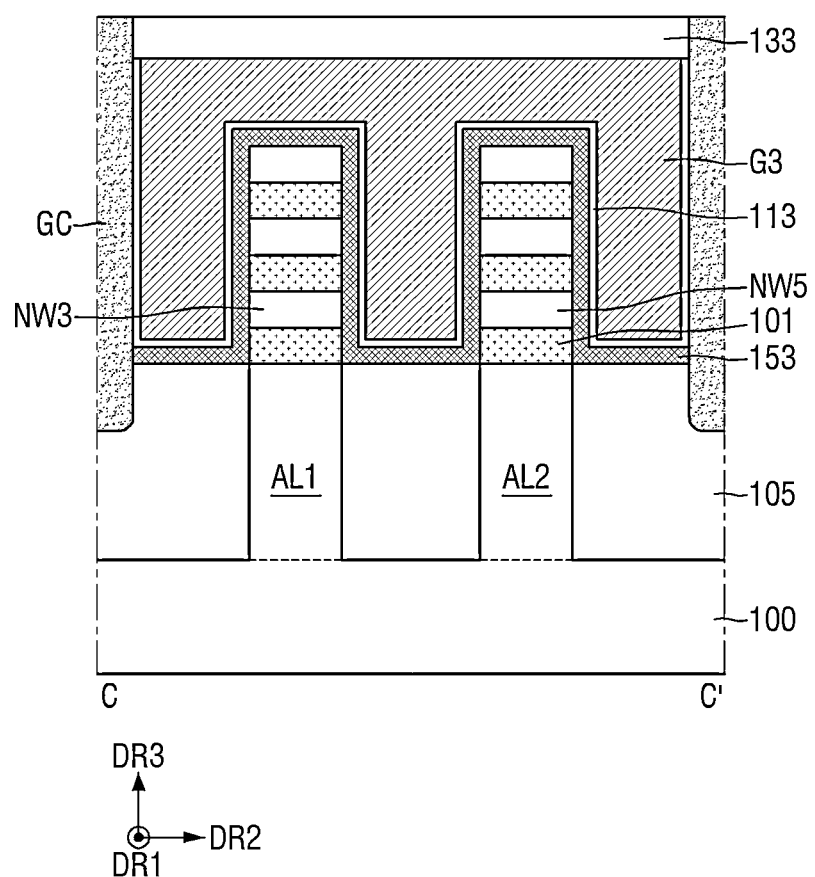

Referring to FIGS. 19 to 21, the protective layer (20 of FIGS. 16 and 18) may be removed. Subsequently, the gate insulating layer and the gate electrode may be formed in the portion from which the first dummy gate (DG1 of FIG. 12) is removed, the portion from which the second dummy gate (DG2 of FIG. 12) is removed, and the portion from which the protective layer (20 of FIGS. 16 and 18) is removed.

For example, the first gate insulating layer 111 and the first gate electrode G1 may be sequentially formed in the portion from which the first dummy gate (DG1 of FIG. 12) is removed. The second gate insulating layer 112 and the second gate electrode G2 may be sequentially formed in the portion from which the second dummy gate (DG2 of FIG. 12) is removed. A third gate insulating layer 113 and a third gate electrode G3 may be sequentially formed in the portion from which the protective layer (20 of FIGS. 16 and 18) is removed. For example, the third gate insulating layer 113 may be formed on the third insulating layer 153. The third gate electrode G3 may be formed on the third gate insulating layer 113.

Subsequently, the first to third capping patterns 131, 132, and 133 may be formed on corresponding ones of the first to third gate insulating layers 111, 112, and 113, corresponding ones of the first to third gate electrodes G1, G2, and G3, and corresponding ones of the first to third gate spacers 121, 122, and 123. For example, the first capping pattern 131 may be formed on the first gate insulating layer 111, the first gate electrode G1, and the first gate spacer 121. The second capping pattern 132 may be formed on the second gate insulating layer 112, the second gate electrode G2, and the second gate spacer 122. The third capping pattern 133 may be formed on the third gate insulating layer 113, the third gate electrode G3, and the third gate spacer 123.

Figure 22:
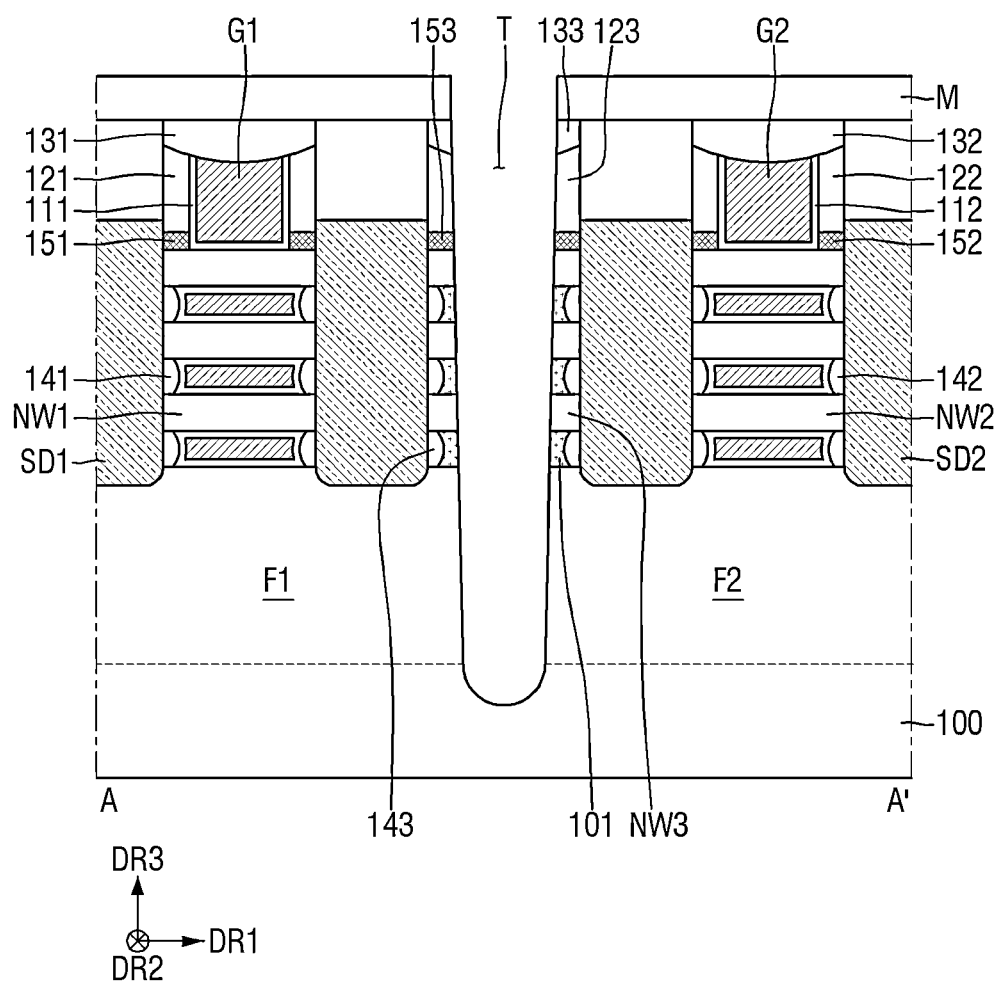
Figure 23:
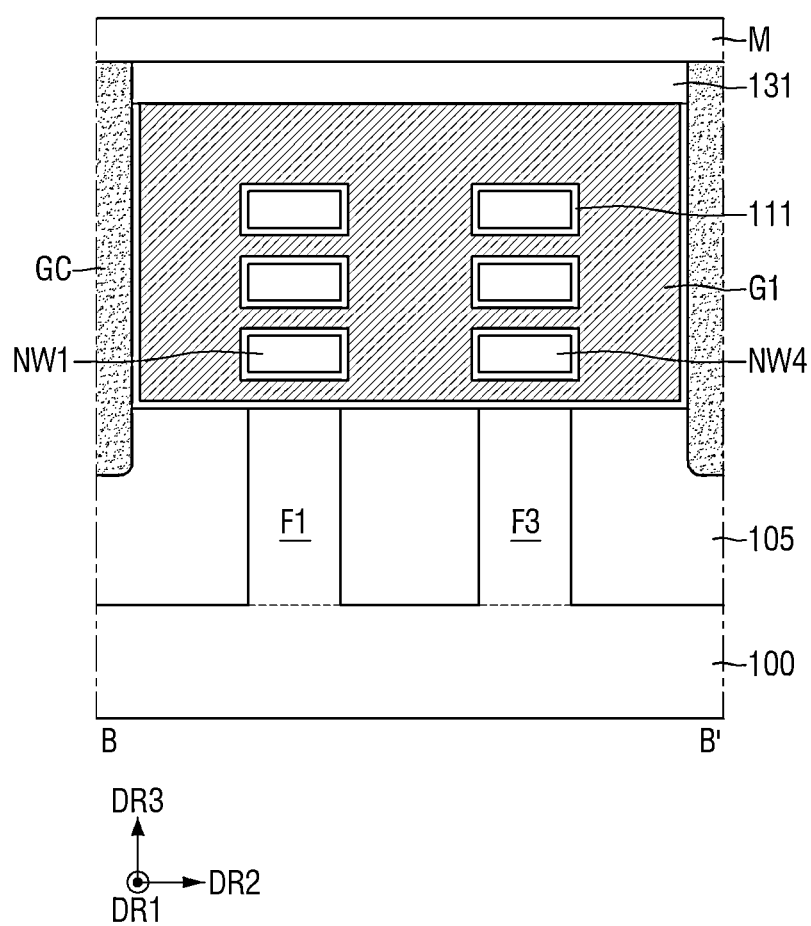
Figure 24:
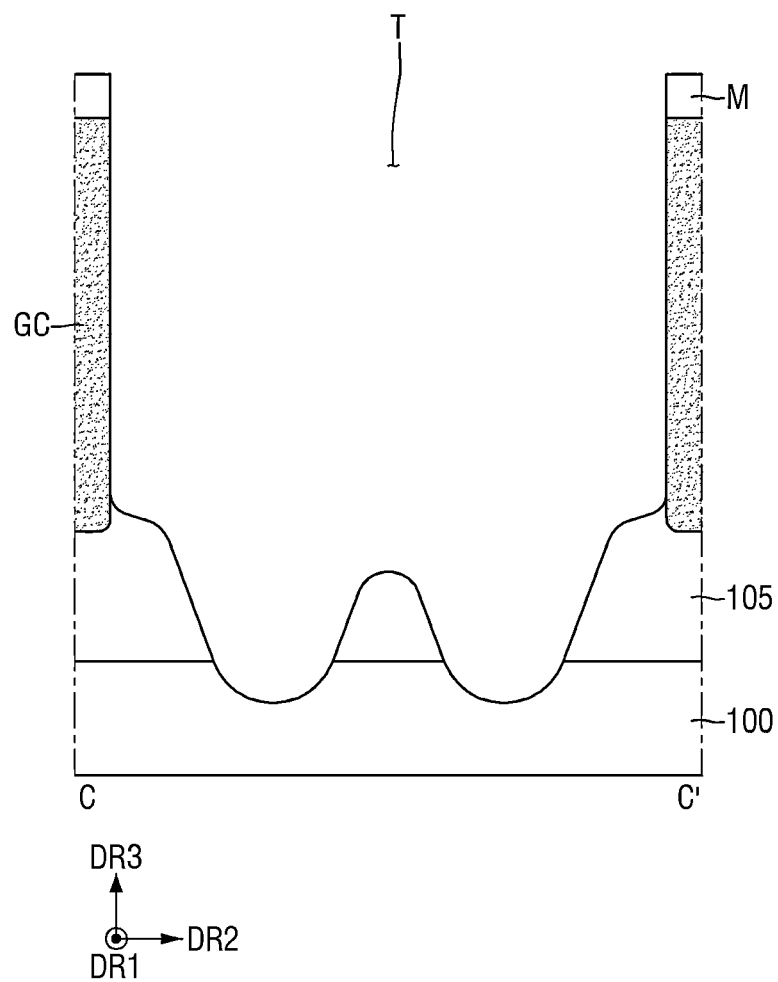

Referring to FIGS. 22 to 24, a mask pattern M for exposing the third gate electrode (G3 of FIG. 19) and the third gate insulating layer (113 of FIG. 19) may be formed on the first interlayer insulating layer 160. Subsequently, a part of the third capping pattern 133, a third gate electrode (G3 of FIG. 19), a third gate insulating layer (113 of FIG. 19), a part of the third insulating layer 153, a part of the third plurality of nanosheets NW3, a part of the sacrificial layer 101, a part of the first active layer AL1, and a part of the second active layer AL2 may be etched by utilizing the mask pattern M as a mask to form the active cut trench T.

For example, during the formation of the active cut trench T, a part of the upper surface of the field insulating layer 105 formed below the third gate electrode (G3 of FIG. 19) may be etched. Further, during the formation of the active cut trench T, a part of the side wall of the field insulating layer 105 formed on the side walls of each of the first active layer AL1 and the second active layer AL2 may be etched.

For example, the active cut trench T may extend to the substrate 100. For example, the active cut trench T may extend to the inside of the substrate 100. That is, the substrate 100 may be exposed by the active cut trench T. Further, the side wall of the gate cut GC may be exposed by the active cut trench T. The active cut trench T may separate the first active layer (AL1 of FIG. 19). The portion in which the first active layer (AL1 of FIG. 19) is separated below the first plurality of nanosheets NW1 may be defined as the first active pattern F1. Further, the portion in which the first active layer (AL1 of FIG. 19) is separated below the second plurality of nanosheets NW2 may be defined as the second active pattern F2. That is, the first active pattern F1 and the second active pattern F2 may be separated in the first horizontal direction DR1 by the active cut trench T.

Figure 25:
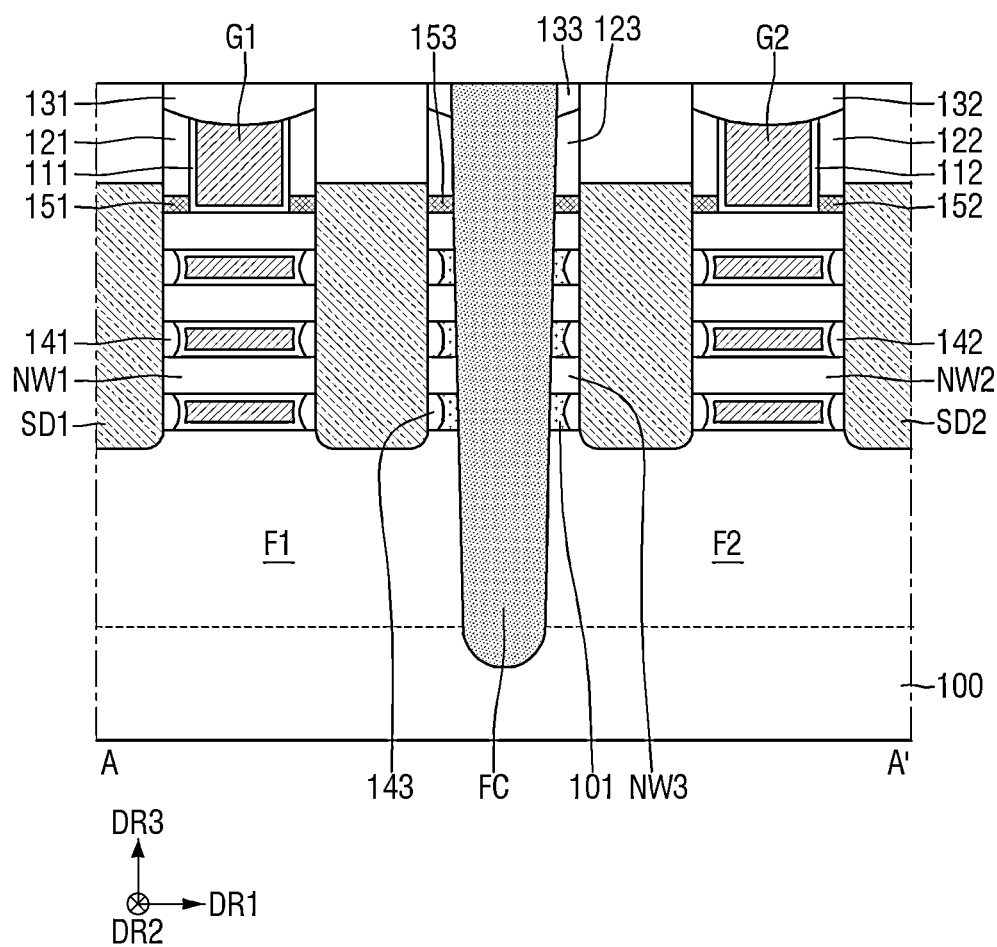
Figure 26:
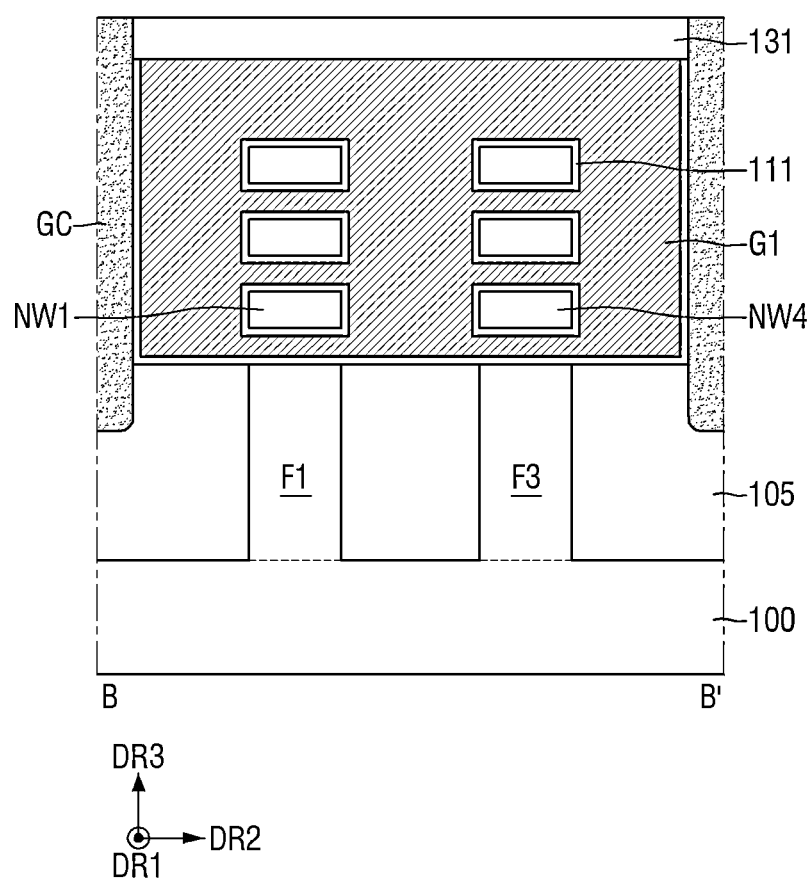
Figure 27:
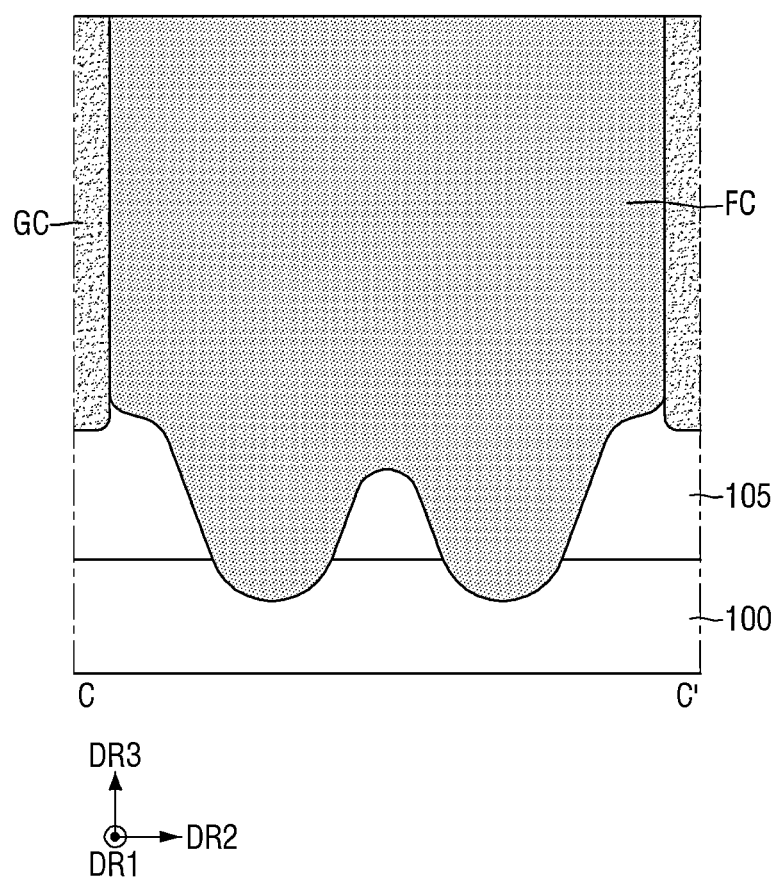

Referring to FIGS. 25 to 27, the mask pattern (M of FIGS. 22 to 24) may be removed. After that, the active cut FC may be formed inside the active cut trench T. For example, the upper surface of the active cut FC may be formed on the same plane as the upper surface of the first interlayer insulating layer 160.

Referring to FIGS. 2 to 4, a source/drain contact CA which penetrates the first interlayer insulating layer 160 in the vertical direction DR3 and is connected to any one of the first and second source/drain regions SD1 and SD2 may be formed. A silicide layer 170 may be formed between each of the first and second source/drain regions SD1 and SD2 and the source/drain contact CA. Further, a gate contact CB which penetrates any one of the first and second capping patterns 131 and 132 in the vertical direction DR3 and is connected to any of the first and second gate electrodes G1 and G2 may be formed.

Subsequently, the etching stop layer 180 and the second interlayer insulating layer 190 may be sequentially formed on each of the first interlayer insulating layer 160, the active cut FC, the gate cut GC, the first to third capping patterns 131, 132, and 133, the source/drain contact CA, and the gate contact CB. Subsequently, the first via V1 that penetrates the second interlayer insulating layer 190 and the etching stop layer 180 in the vertical direction DR3 and is connected to the source/drain contact CA may be formed. Further, the second via V2 which penetrates the second interlayer insulating layer 190 and the etching stop layer 180 in the vertical direction DR3 and is connected to the gate contact CB may be formed. The semiconductor device shown in FIGS. 2 to 4 may be fabricated through such a fabricating process.

In the semiconductor device according to some example embodiments of the present disclosure, a sacrificial layer 101 including silicon germanium (SiGe) may be disposed on both side walls of the active cut FC between a plurality of nanosheets through which the active cut FC is formed. Such a structure may be caused by the configuration in which the gate electrode is not formed between a plurality of nanosheets through which the active cut FC is formed, and the active cut FC penetrating the plurality of nanosheets in the vertical direction DR3 is formed in the fabricating process. Therefore, in the semiconductor device according to some example embodiments of the present disclosure, it is possible to improve reliability of the semiconductor device, by mitigating or preventing a short circuit due to a gate electrode by disposing a sacrificial layer on both side walls of an active cut FC between a plurality of nanosheets through which the active cut FC is formed.

Hereinafter, a semiconductor device according to an example embodiment of the present disclosure will be described referring to FIG. 28. Differences from the semiconductor device shown in FIGS. 1 to 4 will be mainly described.

Figure 28:
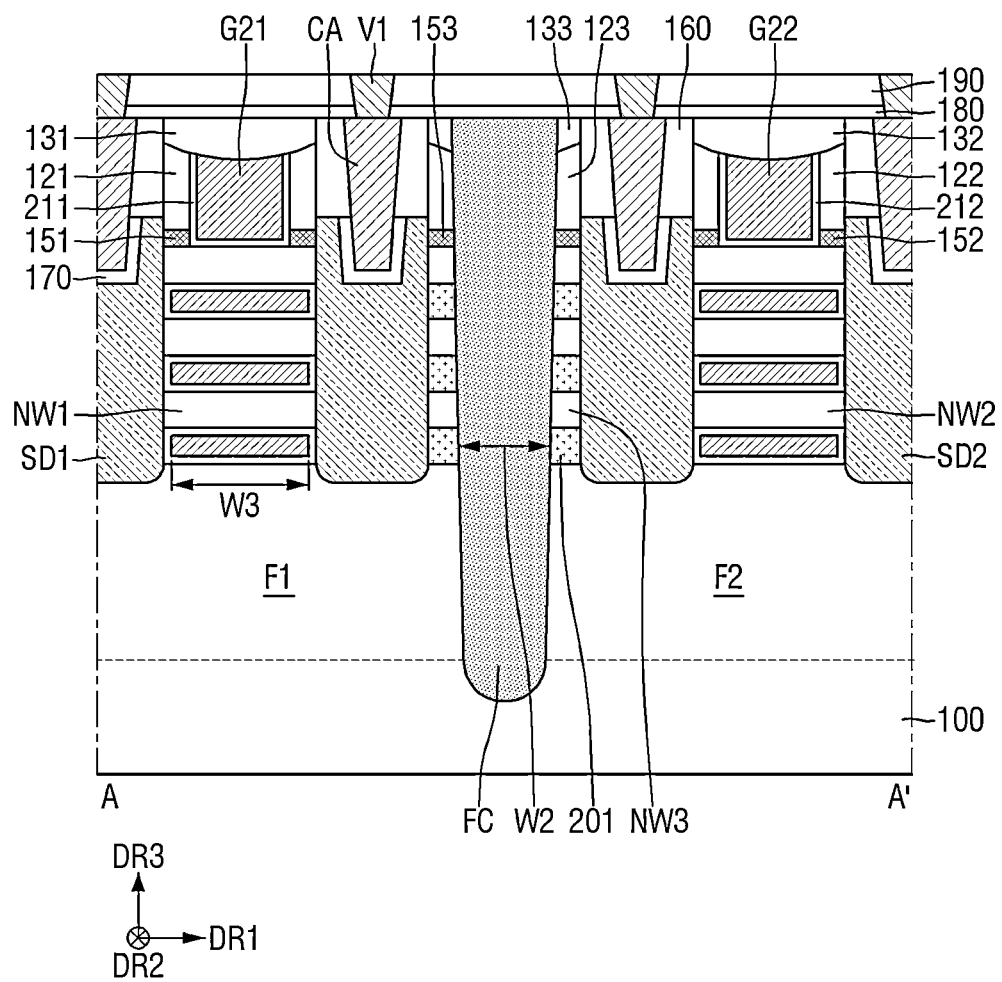
FIG. 28 is a cross-sectional view for explaining a semiconductor device according to an example embodiment of the present disclosure.

FIG. 28 is a cross-sectional view for explaining a semiconductor device according to an example embodiment of the present disclosure.

Referring to FIG. 28, the first to third internal spacers (141, 142, and 143 of FIG. 2) are not disposed in the semiconductor device according to an example embodiment of the present disclosure.

For example, between each of the first plurality of nanosheets NW1, the first gate insulating layer 211 may be in contact with the first source/drain region SD1. The second gate insulating layer 212 may be in contact with the second source/drain region SD2 between the second plurality of nanosheets NW2. The sacrificial layer 201 may be in contact with each of the first source/drain region SD1 and the second source/drain region SD2 between each of the third plurality of nanosheets NW3.

For example, a width W3 in the first horizontal direction DR1 of the first gate electrode G21 disposed between the first active pattern F1 and the first plurality of nanosheets NW1 may be greater than the width W2 in the first horizontal direction DR1 of the active cut FC disposed below the lowermost nanosheet among the third plurality of nanosheets NW3. Further, the width in the first horizontal direction DR1 of the second gate electrode G22 disposed between the second active pattern F2 and the second plurality of nanosheets NW2 may be greater than the width W2 in the first horizontal direction DR1 of the active cut FC disposed below the lowermost nanosheet among the third plurality of nanosheets NW3.

Hereinafter, a semiconductor device according to an example embodiment of the present disclosure will be described referring to FIGS. 29 and 30. Differences from the semiconductor device shown in FIGS. 1 to 4 will be mainly described.

Figure 29:
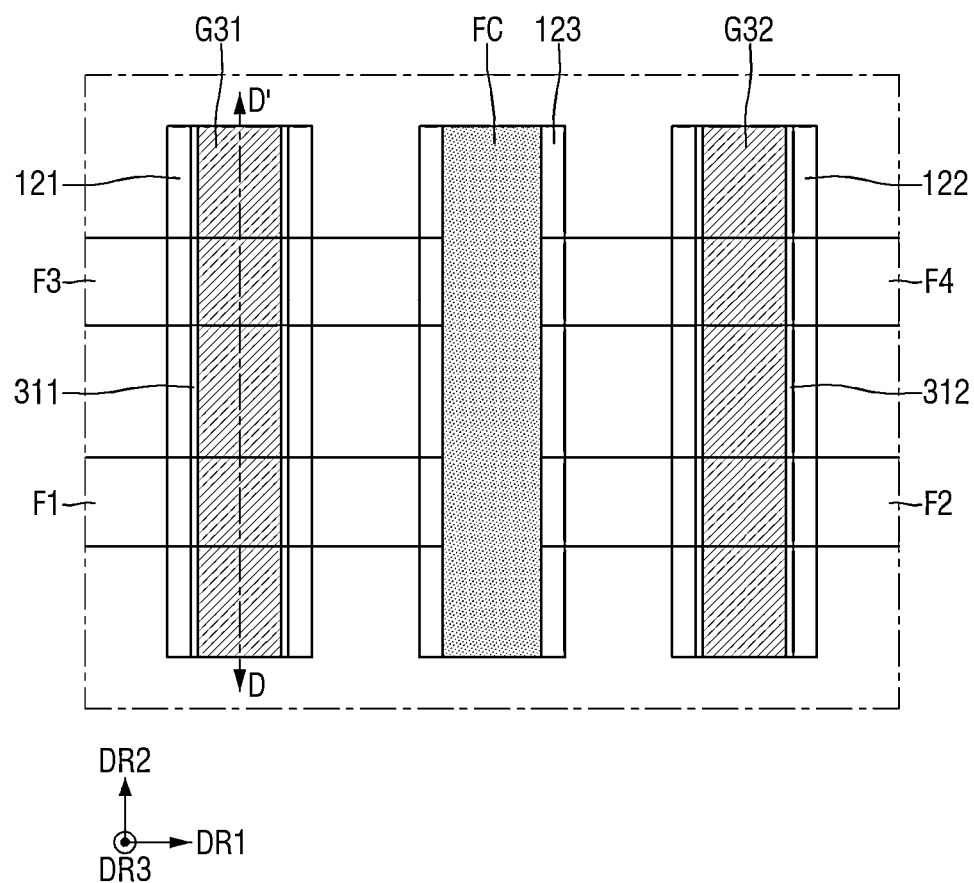
FIG. 29 is a schematic layout diagram for explaining a semiconductor device according to an example embodiment of the present disclosure.

FIG. 29 is a schematic layout diagram for explaining a semiconductor device according to an example embodiment of the present disclosure. FIG. 30 is a cross-sectional view taken along the line D-D' of FIG. 29.

Figure 30:
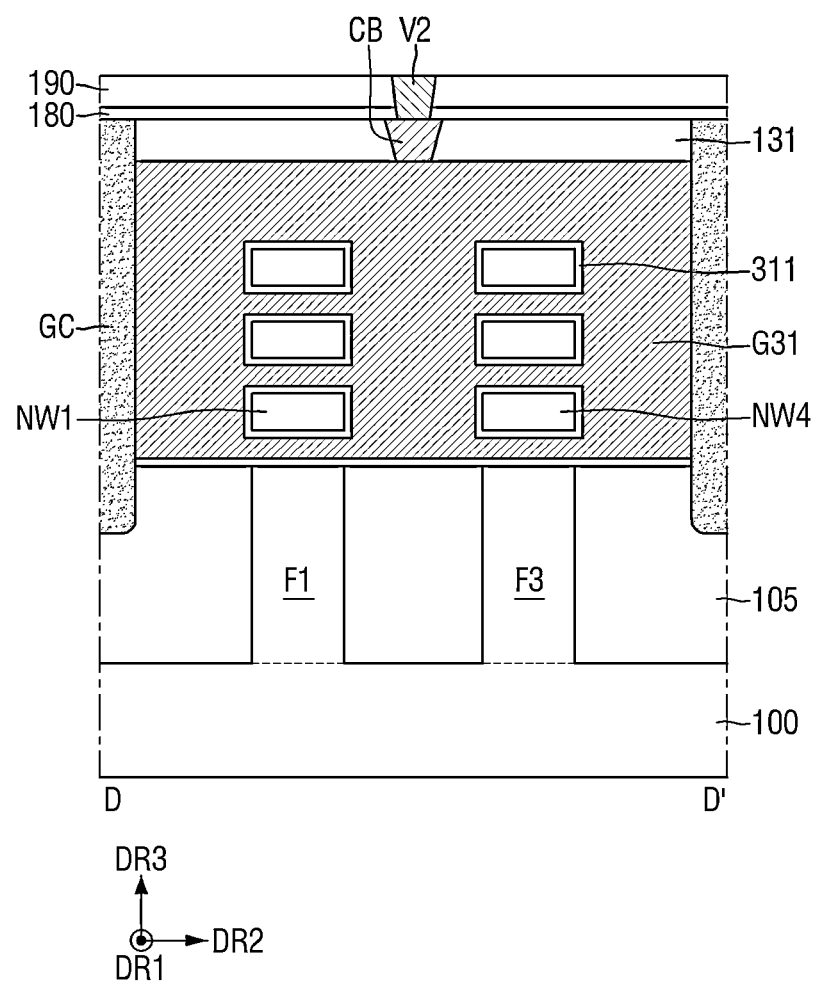
FIG. 30 is a cross-sectional view taken along a line D-D' of FIG. 29.

Referring to FIGS. 29 and 30, in the semiconductor device according to an example embodiment of the present disclosure, a first gate insulating layer 311 may not disposed between the first gate electrode G31 and the gate cut GC. For example, the first gate electrode G31 may be in contact with the gate cut GC. Further, although not shown, a second gate insulating layer 312 may be not disposed between the second gate electrode G32 and the gate cut GC. For example, the second gate electrode G32 may be in contact with the gate cut GC.

Hereinafter, a semiconductor device according to an example embodiment of the present disclosure will be described referring to FIGS. 31 and 32. Differences from the semiconductor device shown in FIGS. 1 to 4 will be mainly described.

Figure 31:
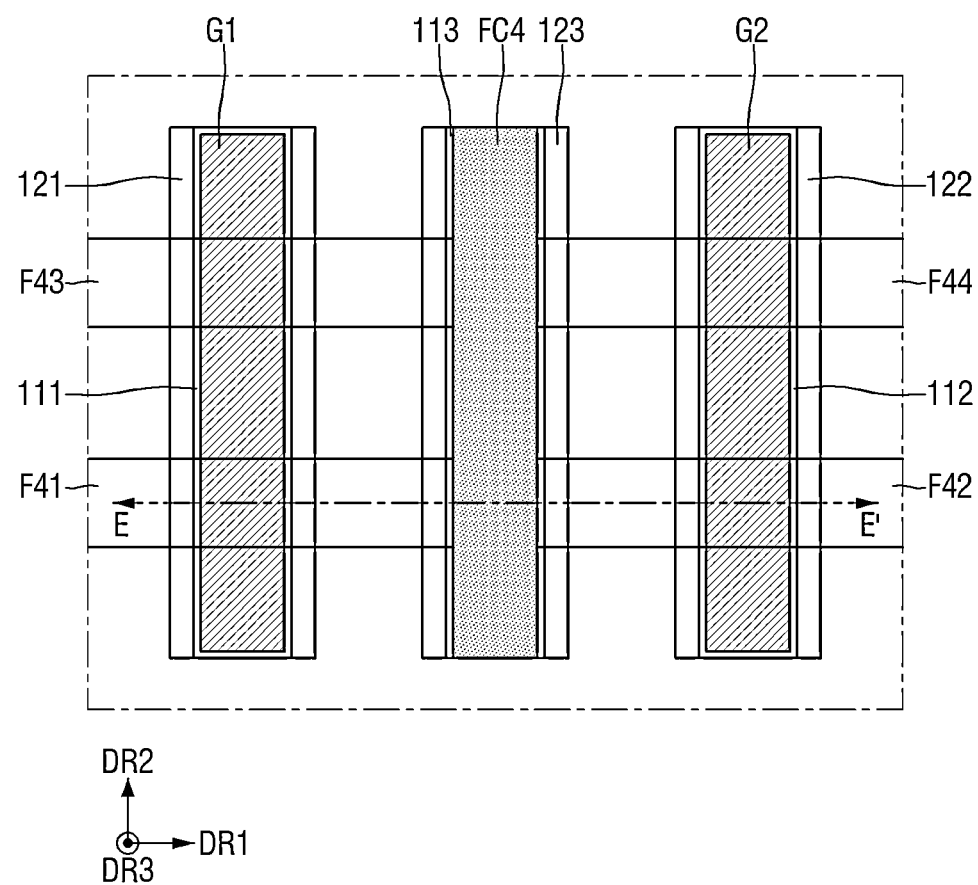
FIG. 31 is a schematic layout diagram for explaining a semiconductor device according to an example embodiment of the present disclosure.

FIG. 31 is a schematic layout diagram for explaining a semiconductor device according to an example embodiment of the present disclosure. FIG. 32 is a cross-sectional view taken along the line E-E' of FIG. 31.

Figure 32:
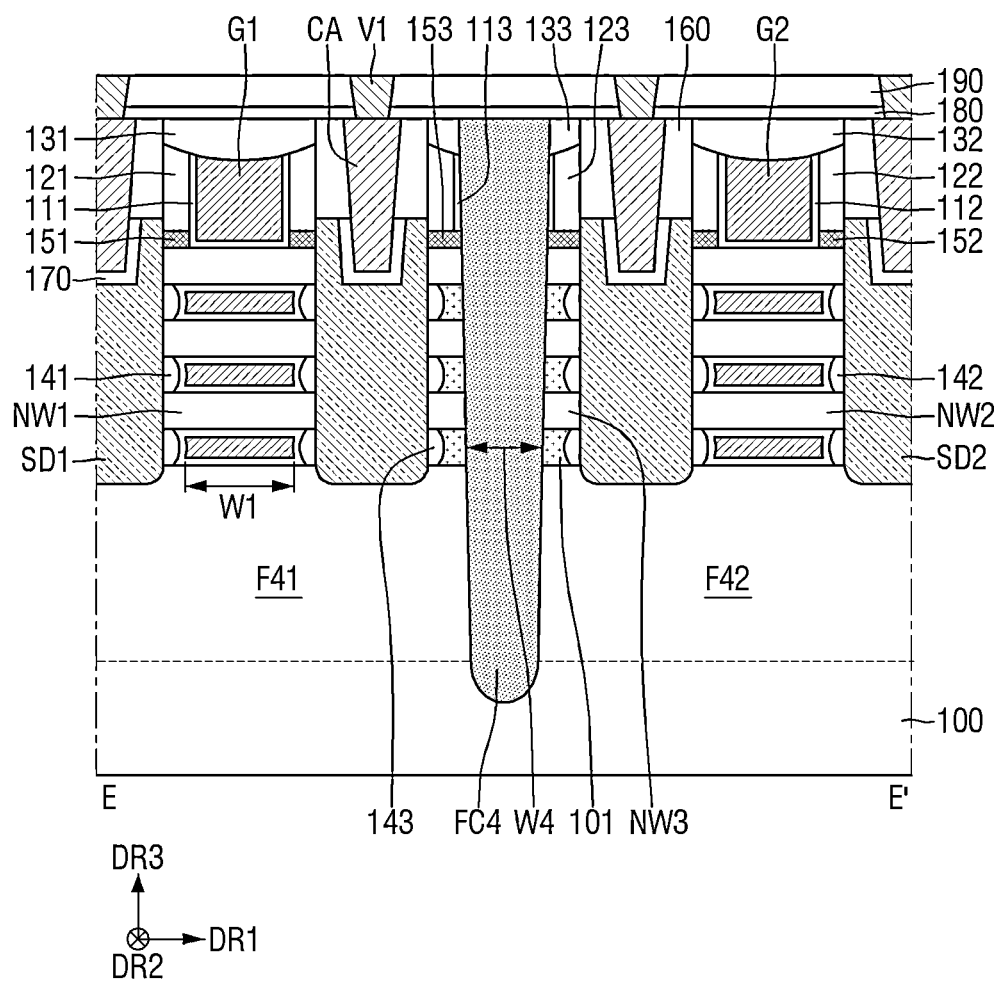
FIG. 32 is a cross-sectional view taken along a line E-E' of FIG. 31.

Referring to FIGS. 31 and 32, in the semiconductor device according to an example embodiment of the present disclosure, the third gate insulating layer 113 may be disposed on the side wall of the active cut FC4.

For example, the third gate insulating layer 113 may be disposed between both side walls of the active cut FC4 and the third gate spacer 123 on the uppermost nanosheet among the plurality of third nanosheets NW3. The third gate insulating layer 113 may be in contact with both side walls of the active cut FC4. The third gate insulating layer 113 may be in contact with the upper surface of the third insulating layer 153 on the uppermost nanosheet among the third plurality of nanosheets NW3. The uppermost surface of the third gate insulating layer 113 may be in contact with the third capping pattern 133.

The third gate insulating layer 113 may overlap each of the first active pattern F41 and the second active pattern F42 in the vertical direction DR3. Further, the third gate insulating layer 113 may overlap each of the third active pattern F43 and the fourth active pattern F44 in the vertical direction DR3.

For example, the width W1 in the first horizontal direction DR1 of the first gate electrode G1 disposed between the first active pattern F41 and the first plurality of nanosheets NW1 may be greater than the width W4 in the first horizontal direction DR1 of the active cut FC4 disposed below the lowermost nanosheet among the third plurality nanosheets NW3. Further, the width in the first horizontal direction DR1 of the second gate electrode G2 disposed between the second active pattern F42 and the second plurality of nanosheets NW2 may be greater than the width W4 in the first horizontal direction DR1 of the active cut FC4 disposed below the lowermost nanosheet among the third plurality of nanosheets NW3.

Hereinafter, a semiconductor device according to an example embodiment of the present disclosure will be described referring to FIGS. 33 and 34. Differences from the semiconductor device shown in FIGS. 1 to 4 will be mainly described.

Figure 33:
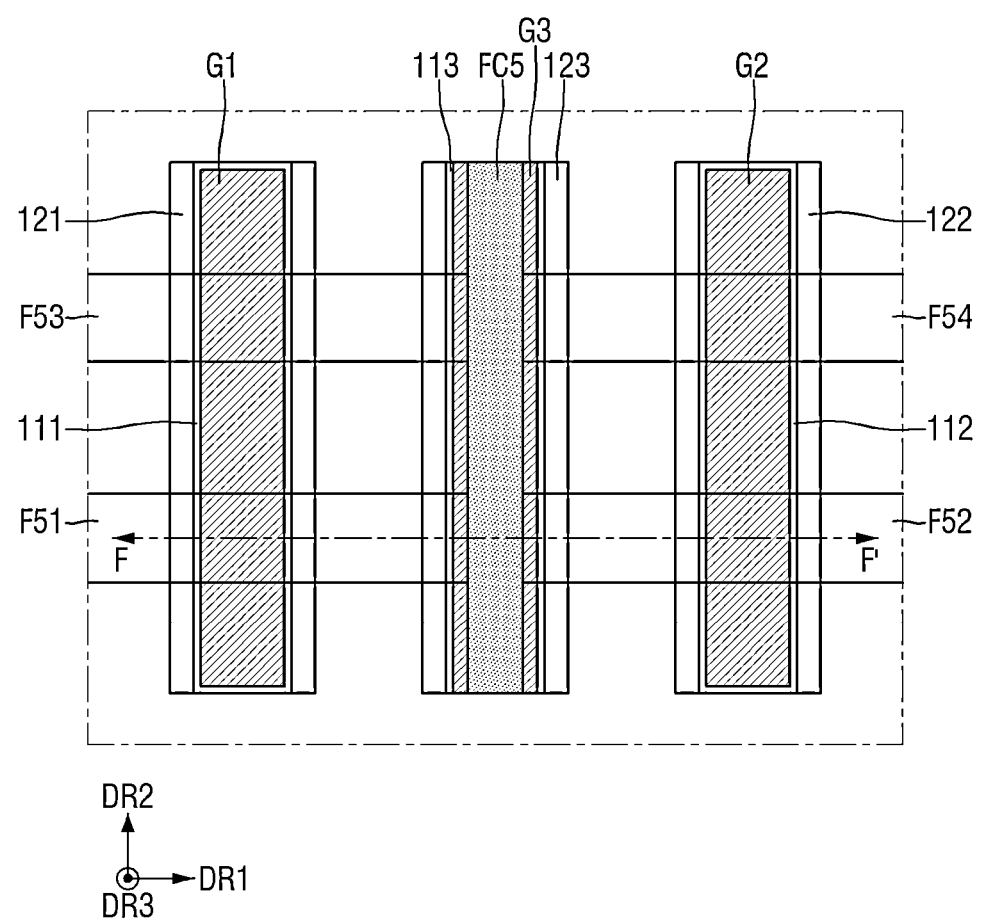
FIG. 33 is a schematic layout diagram for explaining a semiconductor device according to an example embodiment of the present disclosure.

FIG. 33 is a schematic layout diagram for explaining a semiconductor device according to an example embodiment of the present disclosure. FIG. 34 is a cross-sectional view taken along the line F-F' of FIG. 33.

Figure 34:
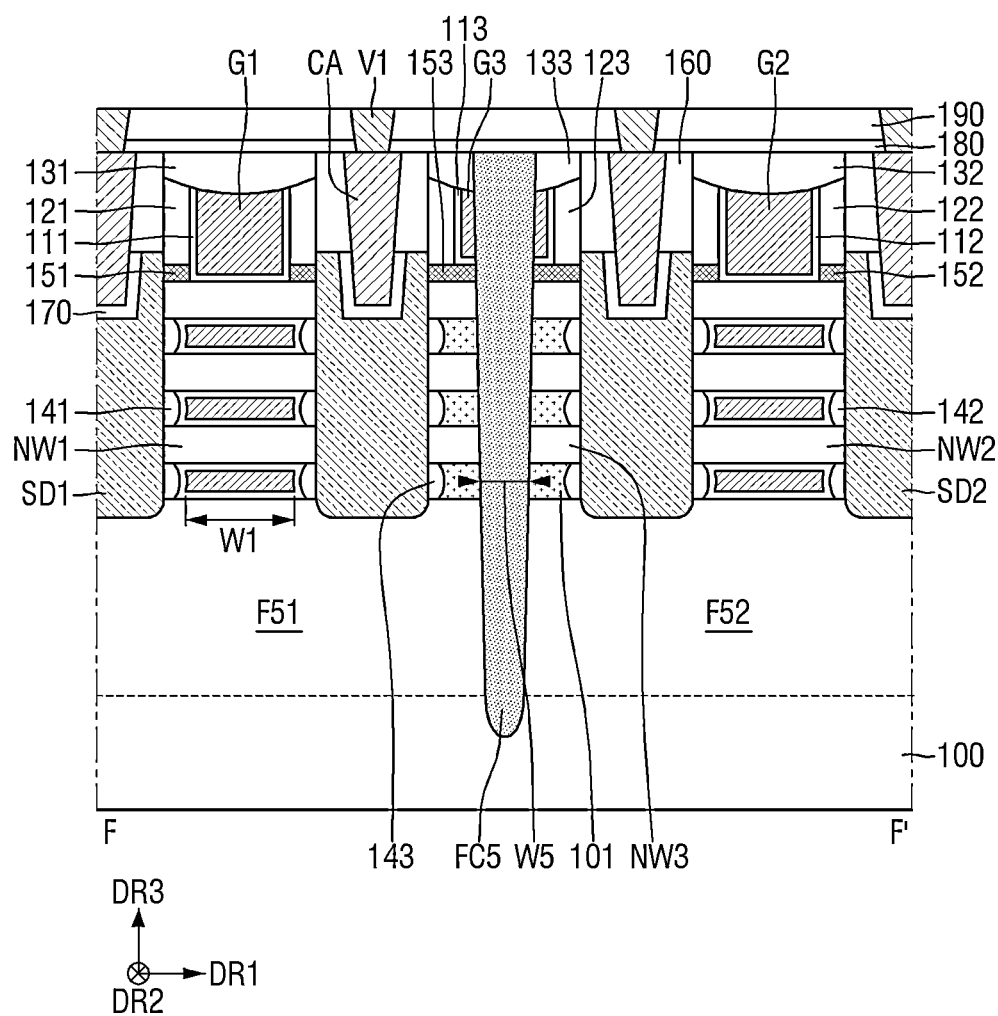
FIG. 34 is a cross-sectional view taken along a line F-F' of FIG. 33.

Referring to FIGS. 33 and 34, in a semiconductor device according to an example embodiment of the present disclosure, the third gate insulating layer 113 and the third gate electrode G3 may be disposed on the side wall of the active cut FC5.

For example, the third gate electrode G3 may be disposed between both side walls of the active cut FC5 and the third gate spacer 123 on the uppermost nanosheet among the third plurality of nanosheets NW3. The third gate electrode G3 may be in contact with both side walls of the active cut FC5.

The third gate electrode G3 may extend in the second horizontal direction DR2 along both side walls of the active cut FC5.

The third gate insulating layer 113 may be disposed between the third gate electrode G3 and the third gate spacer 123 on the uppermost nanosheet among the third plurality of nanosheets NW3. Further, the third gate insulating layer 113 may be disposed between the third insulating layer 153 and the third gate electrode G3 on the uppermost nanosheet among the third plurality of nanosheets NW3. The third gate insulating layer 113 may be in contact with the upper surface of the third insulating layer 153 on the uppermost nanosheet among the third plurality of nanosheets NW3. The upper surface of the third gate electrode G3 and the uppermost surface of the third gate insulating layer 113 may be in contact with the third capping pattern 133.

Each of the third gate electrode G3 and the third gate insulating layer 113 may overlap each of the first active pattern F51 and the second active pattern F52 in the vertical direction DR3. Further, each of the third gate electrode G3 and the third gate insulating layer 113 may overlap each of the third active pattern F53 and the fourth active pattern F54 in the vertical direction DR3.

For example, the width W1 in the first horizontal direction DR1 of the first gate electrode G1 disposed between the first active pattern F51 and the first plurality of nanosheets NW1 may be greater than the width W5 in the first horizontal direction DR1 of the active cut FC5 disposed below the lowermost nanosheet among the third plurality of nanosheets NW3. Further, the width in the first horizontal direction DR1 of the second gate electrode G2 disposed between the second active pattern F52 and the second plurality of nanosheets NW2 may be greater than the width W5 in the first horizontal direction DR1 of the active cut FC5 disposed below the lowermost nanosheet among the third plurality of nanosheets NW3.

In concluding the detailed description, those skilled in the art will appreciate that many variations and modifications may be made to the disclosed example embodiments without substantially departing from the principles of the present disclosure. Therefore, the disclosed example embodiments of the disclosure are used in a generic and descriptive sense only and not for purposes of limitation.

What is claimed is:

1. A semiconductor device comprising:
   a substrate;
   a first active pattern extending in a first horizontal direction on the substrate;
   a second active pattern extending in the first horizontal direction on the substrate, and spaced apart from the first active pattern in the first horizontal direction;
   a first plurality of nanosheets spaced apart from each other in a vertical direction on the first active pattern;
   a second plurality of nanosheets spaced apart from each other in the vertical direction on the first and second active patterns;
   a first gate electrode extending in a second horizontal direction different from the first horizontal direction on the first active pattern, and surrounding the first plurality of nanosheets;
   a source/drain region between the first plurality of nanosheets and the second plurality of nanosheets;
   an active cut penetrating the plurality of second nanosheets in the vertical direction, extending to the substrate, and separating the first and second active patterns; and
   a sacrificial layer between the source/drain region and the active cut, being in contact with the active cut, and including silicon germanium (SiGe).

2. The semiconductor device of claim 1, wherein a width in the first horizontal direction of the first gate electrode between the first active pattern and the first plurality of nanosheets is greater than a width in the first horizontal direction of the active cut below a lowermost nanosheet among the second plurality of nanosheets.

3. The semiconductor device of claim 1, further comprising:
   an interlayer insulating layer surrounding side walls of the first gate electrode on the source/drain region,
   wherein an upper surface of the active cut is on a same plane as an upper surface of the interlayer insulating layer.

4. The semiconductor device of claim 1, further comprising:
   a gate spacer on an uppermost nanosheet among the second plurality of nanosheets and extending in the second horizontal direction along side walls of the active cut; and
   an insulating layer between the uppermost nanosheet among the second plurality of nanosheets and the gate spacer, being in contact with the active cut and including a material different from the gate spacer.

5. The semiconductor device of claim 1, further comprising:
   a gate spacer on an uppermost nanosheet among the second plurality of nanosheets and extending in the second horizontal direction along side walls of the active cut; and
   a capping pattern on the gate spacer,
   wherein the capping pattern is in contact with the side walls of the active cut.

6. The semiconductor device of claim 5, wherein an upper surface of the active cut is on a same plane as an upper surface of the capping pattern.

7. The semiconductor device of claim 1, further comprising:
   an internal spacer between the source/drain region and the sacrificial layer and being in contact with the source/drain region.

8. The semiconductor device of claim 1, wherein the sacrificial layer is in contact with the source/drain region.

9. The semiconductor device of claim 1, further comprising:
   a gate cut at a distal end of the first gate electrode in the second horizontal direction; and
   a gate insulating layer being between the first gate electrode and the first plurality of nanosheets and between the first gate electrode and the gate cut.

10. The semiconductor device of claim 1, further comprising:
    a gate cut at a distal end of the first gate electrode in the second horizontal direction and being in contact with the first gate electrode.

11. The semiconductor device of claim 1, further comprising:
    a gate spacer on an uppermost nanosheet among the second plurality of nanosheets and extending in the second horizontal direction along side walls of the active cut; and
    a gate insulating layer between the gate spacer and the active cut and in contact with the active cut.

12. The semiconductor device of claim 1, further comprising:

a second gate electrode on an uppermost nanosheet among the second plurality of nanosheets and extending in the second horizontal direction along side walls of the active cut, is the second gate electrode being in contact with the active cut.

13. A semiconductor device comprising:
a substrate;
a first active pattern extending in a first horizontal direction on the substrate;
a second active pattern extending in the first horizontal direction on the substrate and spaced apart from the first active pattern in the first horizontal direction;
a plurality of nanosheets spaced apart from each other in a vertical direction on the first and second active patterns;
an active cut penetrating the plurality of nanosheets in the vertical direction, extending to the substrate, and separating the first and second active patterns from each other;
a sacrificial layer between each of the first and second active patterns and a lowermost nanosheet among the plurality of nanosheets, being in contact with the active cut, and including silicon germanium (SiGe);
a gate spacer on an uppermost nanosheet among the plurality of nanosheets and extending in a second horizontal direction different from the first horizontal along side walls of the active cut; and
an insulating layer between the uppermost nanosheet among the plurality of nanosheets and the gate spacer, being in contact with the active cut, and including a material different from the gate spacer.

14. The semiconductor device of claim 13, further comprising:
a source/drain region on the first active pattern and on the side walls of the active cut, and the source/drain region being in contact with the plurality of nanosheets; and
an internal spacer between the source/drain region and the sacrificial layer and being in contact with the source/drain region.

15. The semiconductor device of claim 13, further comprising:
a source/drain region on the first active pattern and on the side walls of the active cut, the source/drain region being in contact with each of the plurality of nanosheets and the sacrificial layer.

16. The semiconductor device of claim 13, wherein the gate spacer is in contact with the side walls of the active cut.

17. The semiconductor device of claim 13, further comprising:
a gate insulating layer between the gate spacer and the side walls of the active cut and being in contact with the side walls of the active cut.

18. The semiconductor device of claim 13, further comprising:
a gate electrode between the gate spacer and the side walls of the active cut, extending in the second horizontal direction, and being in contact with the side walls of the active cut.

19. A semiconductor device comprising:
a substrate;
a first active pattern extending in a first horizontal direction on the substrate;
a second active pattern extending in the first horizontal direction on the substrate, and spaced apart from the first active pattern in the first horizontal direction;
a first plurality of nanosheets spaced apart from each other in a vertical direction on the first active pattern;
a second plurality of nanosheets spaced apart from each other in the vertical direction on the second active pattern;
a third plurality of nanosheets spaced apart from each other in the vertical direction on each of the first and second active patterns;
a first gate electrode on the first active pattern, the first gate electrode extending in a second horizontal direction different from the first horizontal direction, and surrounding the first plurality of nanosheets;
a second gate electrode on the second active pattern, the second gate electrode extending in the second horizontal direction and surrounding the second plurality of nanosheets;
a first source/drain region between the first plurality of nanosheets and the third plurality of nanosheets;
a second source/drain region between the third plurality of nanosheets and the second plurality of nanosheets;
an active cut penetrating the third plurality of nanosheets in the vertical direction, extending to the substrate, and separating the first and second active patterns; and
a sacrificial layer between each of the first and second source/drain regions and the active cut, being in contact with the active cut, and including silicon germanium (SiGe),
wherein a width in the first horizontal direction of the first gate electrode between the first active pattern and the first plurality of nanosheets is greater than a width in the first horizontal direction of the active cut below a lowermost nanosheet among the third plurality of nanosheets.

20. The semiconductor device of claim 19, further comprising:
an internal spacer between each of the first and second source/drain regions and the sacrificial layer and being in contact with each of the first and second source/drain regions.

* * * * *